(12) United States Patent
Yang et al.

(10) Patent No.: US 11,495,682 B2
(45) Date of Patent: Nov. 8, 2022

(54) SEMICONDUCTOR DEVICE AND METHOD

(71) Applicant: Taiwan Semiconductor Manufacturing Company, Ltd., Hsinchu (TW)

(72) Inventors: Chih-Chuan Yang, Hsinchu (TW); Shih-Hao Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/802,873

(22) Filed: Feb. 27, 2020

(65) Prior Publication Data

US 2021/0273096 A1   Sep. 2, 2021

(51) Int. Cl.
| | | |
|---|---|---|
| H01L 29/49 | (2006.01) | |
| H01L 29/786 | (2006.01) | |
| H01L 29/423 | (2006.01) | |
| H01L 29/66 | (2006.01) | |
| H01L 29/06 | (2006.01) | |
| H01L 29/78 | (2006.01) | |
| H01L 21/8238 | (2006.01) | |
| H01L 29/165 | (2006.01) | |
| H01L 29/267 | (2006.01) | |

(Continued)

(52) U.S. Cl.
CPC .... *H01L 29/7845* (2013.01); *H01L 21/02532* (2013.01); *H01L 21/02603* (2013.01); *H01L 21/3065* (2013.01); *H01L 21/31116* (2013.01); *H01L 21/823807* (2013.01); *H01L 21/823814* (2013.01); *H01L 21/823828* (2013.01); *H01L 21/823864* (2013.01); *H01L 21/823892* (2013.01); *H01L 27/092* (2013.01); *H01L 29/0673* (2013.01); *H01L 29/1083* (2013.01); *H01L 29/165* (2013.01); *H01L 29/267* (2013.01); *H01L 29/42392* (2013.01); *H01L 29/66537* (2013.01); *H01L 29/66545* (2013.01); *H01L 29/66553* (2013.01); *H01L 29/66742* (2013.01); *H01L 29/78618* (2013.01); *H01L 29/78696* (2013.01)

(58) Field of Classification Search
CPC ....... H01L 21/823431; H01L 29/66795; H01L 21/823412; H01L 29/401; H01L 29/1079; B82Y 10/00
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |

(Continued)

*Primary Examiner* — Brian Turner
(74) *Attorney, Agent, or Firm* — Slater Matsil, LLP

(57) ABSTRACT

Nanostructure field-effect transistors (NSFETs) including isolation layers formed between epitaxial source/drain regions and semiconductor substrates and methods of forming the same are disclosed. In an embodiment, a semiconductor device includes a semiconductor substrate; a gate stack over the semiconductor substrate, the gate stack including a gate electrode and a gate dielectric layer; a first epitaxial source/drain region adjacent the gate stack; and a high-k dielectric layer extending between the semiconductor substrate and the first epitaxial source/drain region, the high-k dielectric layer contacting the first epitaxial source/drain region, the gate dielectric layer and the high-k dielectric layer including the same material.

20 Claims, 39 Drawing Sheets

(51) Int. Cl.
*H01L 29/10* (2006.01)
*H01L 21/02* (2006.01)
*H01L 21/3065* (2006.01)
*H01L 21/311* (2006.01)
*H01L 27/092* (2006.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2017/0018462 A1* | 1/2017 | Suk .................... H01L 27/1211 |
| 2017/0179299 A1* | 6/2017 | Bae .................... H01L 29/0673 |
| 2018/0269320 A1* | 9/2018 | Chi .................... H01L 29/66795 |
| 2020/0066894 A1* | 2/2020 | Frougier ............... H01L 27/088 |
| 2020/0083219 A1* | 3/2020 | Kang ................. H01L 21/3086 |
| 2020/0091152 A1* | 3/2020 | Noh ................ H01L 21/823871 |
| 2020/0135859 A1* | 4/2020 | Wan .................... H01L 29/0847 |
| 2020/0219979 A1* | 7/2020 | Rachmady .......... H01L 21/8221 |
| 2020/0303500 A1* | 9/2020 | Lou ....................... H01L 29/785 |
| 2020/0365687 A1* | 11/2020 | Xie .................... H01L 29/6656 |
| 2021/0098634 A1* | 4/2021 | Chung ............... H01L 29/66787 |
| 2021/0135016 A1* | 5/2021 | Wan ................. H01L 29/78696 |

* cited by examiner

SEMICONDUCTOR DEVICE AND METHOD

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
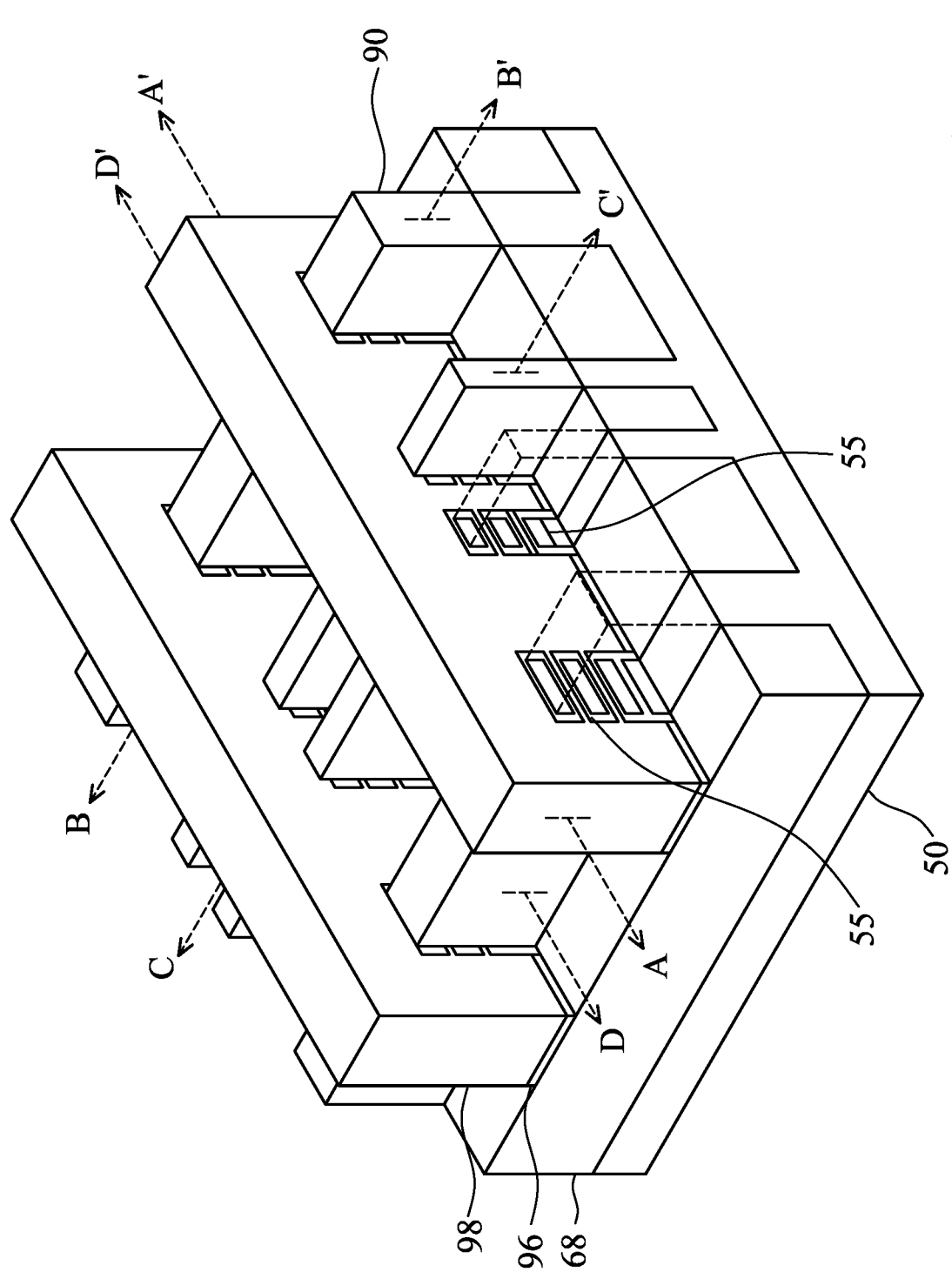
FIG. 1 illustrates an example of a nanostructure field-effect transistor (NSFET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide semiconductor devices having reduced leakage and improved performance and methods of forming the same. The semiconductor devices may be nanostructure (e.g., nanosheet, nanowire, gate-all-around, or the like) field-effect transistors (NSFETs). Thin semiconductor layers may be provided in NMOS and PMOS regions below semiconductor layers used to form channel regions in the NSFETs. The thin semiconductor layers may be replaced with dielectric materials, such as high-k dielectric materials. The dielectric materials may extend between bulk regions of the NSFETs and each of source/drain regions, the channel regions, and gates of the NSFETs. The dielectric materials reduce leakage from the source/drain regions to the bulk regions, prevent latch-up issues in completed semiconductor devices, and improve device performance.

FIG. 1 illustrates an example of NSFETs in a three-dimensional view, in accordance with some embodiments. The NSFETs comprise nanostructures 55 over a substrate 50 (e.g., a semiconductor substrate). Isolation regions 68 are disposed in the substrate 50, and the nanostructures 55 are disposed above and between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, the substrate 50 may comprise a single material or a plurality of materials.

Gate dielectric layers 96 are along sidewalls and over top surfaces of the substrate 50 and along top surfaces, sidewalls, and bottom surfaces of the nanostructures 55. Gate electrodes 98 are over the gate dielectric layers 96. Epitaxial source/drain regions 90 are disposed on opposite sides of the nanostructures 55, the gate dielectric layers 96, and the gate electrodes 98 with respect to longitudinal axes of the gate electrodes 98. FIG. 1 further illustrates reference cross-sections that are used in later figures. Cross-section A-A' is along a longitudinal axis of a gate electrode 98 and in a direction, for example, perpendicular to the direction of current flow between the epitaxial source/drain regions 90 of a NSFET. Cross-section B-B' is perpendicular to cross-section A-A' and is along a longitudinal axis of a nanostructure 55 in a first conductivity region of the NSFET and in a direction of, for example, a current flow between the epitaxial source/drain regions 90 of the NSFET. Cross-section C-C' is parallel to cross-section B-B' and extends through a nanostructure 55 in a second conductivity region of the NSFET. Cross-section D-D' is parallel to cross-section A-A' and extends through epitaxial source/drain regions 90 of the NSFETs. Subsequent figures refer to these reference cross-sections for clarity.

Some embodiments discussed herein are discussed in the context of NSFETs formed using a gate-last process. In other embodiments, a gate-first process may be used. Also, some embodiments contemplate aspects used in planar devices, such as planar FETs or in fin field-effect transistors (FinFETs).

FIGS. 2 through 18C are cross-sectional views of intermediate stages in the manufacturing of NSFETs, in accordance with some embodiments. FIGS. 2 through 5, 6A, 12A, 13A, 14A, 15A, 16A, 17A, and 18A illustrate reference cross-section A-A' illustrated in FIG. 1. FIGS. 6B and 7 illustrate reference cross-sections B-B' or C-C' illustrated in FIG. 1. FIGS. 8A, 9A, 10A, 11A, 12B, 13B, 14B, 15B, 16B, 17B, and 18B illustrate reference cross-section B-B' illustrated in FIG. 1. FIGS. 8B, 9B, 10B, 11B, 12C, 13C, 14C, 15C, 16C, 17C, and 18C illustrate reference cross-section C-C' illustrated in FIG. 1. FIG. 16D illustrates reference cross-sections B-B' and C-C illustrated in FIG. 1. FIGS. 11C and 11D are illustrated along reference cross-section D-D' illustrated in FIG. 1.

Figure 2:
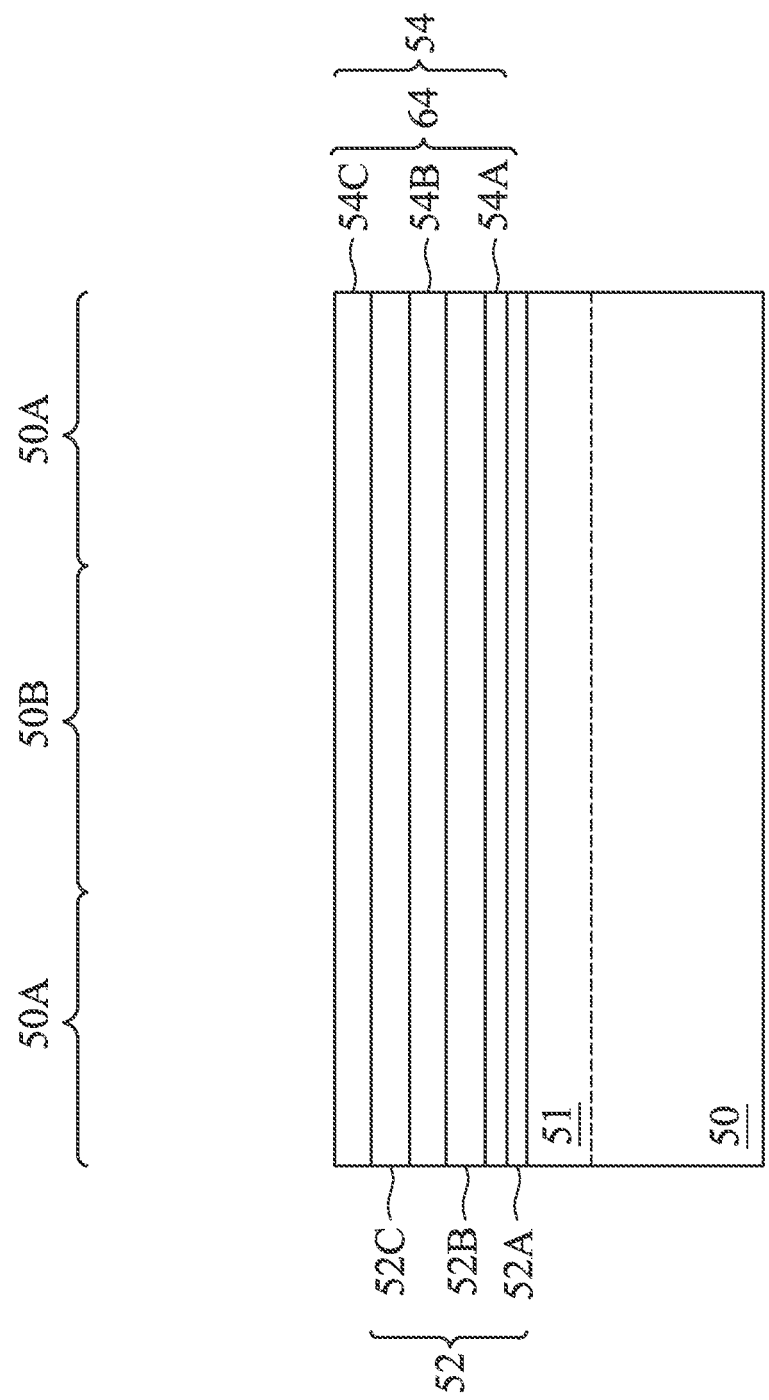
FIGS. 2, 3, 4, 5, 6A, 6B, 7, 8A, 8B, 9A, 9B, 10A, 10B, 11A, 11B, 11C, 11D, 12A, 12B, 12C, 13A, 13B, 13C, 14A, 14B, 14C, 15A, 15B, 15C, 16A, 16B, 16C, 16D, 17A, 17B, 17C, 18A, 18B, and 18C are cross-sectional views of intermediate stages in the manufacturing of NSFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has regions 50A and a region 50B. The regions 50A can be for forming devices having a first conductivity type (e.g., n-type devices, such as NMOS transistors or n-type NSFETs or p-type devices, such as PMOS transistors or p-type NSFETs). The region 50B can be for forming devices having a second conductivity type opposite the first conductivity type. For example, in embodiments in which the first conductivity type is p-type, the second conductivity type may be n-type and in embodiments in which the first conductivity type is n-type, the second conductivity type may be p-type. The regions 50A may be physically separated from the region 50B (not separately illustrated), and any number of device features (e.g., other active devices, doped regions, isolation structures, etc.) may be disposed between the regions 50A and the region 50B. Although two regions 50A and one region 50B are illustrated, any number of regions 50A and regions 50B may be provided.

The substrate 50 may be lightly doped with a p-type or an n-type impurity. An anti-punch-through (APT) implantation may be performed on an upper portion of the substrate 50 to form an APT region 51. During the APT implantation, dopants may be implanted in the regions 50A and the region 50B. The dopants may have a conductivity type opposite a conductivity type of source/drain regions to be formed in each of the regions 50A and the region 50B. The APT region 51 may extend under subsequently formed source/drain regions in the resulting NSFETs, which will be formed in subsequent processes. The APT region 51 may be used to reduce the leakage from the source/drain regions to the substrate 50. In some embodiments, the doping concentration in APT region 51 may be from about $1 \times 10^{13}$ atoms/cm$^3$ to about $1 \times 10^{14}$ atoms/cm$^3$. For simplicity and legibility, the APT region 51 is not illustrated in subsequent drawings.

Further in FIG. 2, a multi-layer stack 64 is formed over the substrate 50. The multi-layer stack 64 includes alternating first semiconductor layers 52 and second semiconductor layers 54 of different semiconductor materials. The first semiconductor layers 52 may be formed of first semiconductor materials, which may include, for example, silicon germanium (SiGe); III-V compound semiconductor materials, such as gallium arsenide (GaAs), indium nitride (InN), indium phosphide (InP), gallium phosphide (GaP), gallium nitride (GaN); or the like. The second semiconductor layers 54 may be formed of second semiconductor materials, which may include, for example, silicon (Si), silicon carbon (SiC), or the like. In other embodiments, the first semiconductor layers 52 may be formed of the second semiconductor materials and the second semiconductor layers 54 may be formed of the first semiconductor materials. For purposes of illustration, the multi-layer stack 64 includes three of the first semiconductor layers 52 (e.g., first semiconductor layers 52A-52C) and three of the second semiconductor layers 54 (e.g., second semiconductor layers 54A-54C). In other embodiments, the multi-layer stack 64 may include any number of the first semiconductor layers 52 and the second semiconductor layers 54. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like.

The first semiconductor layer 52A and the second semiconductor layer 54A may be sacrificial layers and the first semiconductor layers 52B and 52C and the second semiconductor layers 54B and 54C may be channel layers. As illustrated in FIG. 2, the channel layers (e.g., the first semiconductor layers 52B and 52C and the second semiconductor layers 54B and 54C) may have thicknesses greater than the sacrificial layers (e.g., the first semiconductor layer 52A and the second semiconductor layer 54A). For example, the sacrificial layers may have thicknesses from about 4 nm to about 6 nm, such as about 5 nm. The channel layers may have thicknesses from about 8 nm to about 10 nm, such as about 9 nm. A ratio of the thicknesses of the channel layers to the thicknesses of the sacrificial layers may be from about 1.5 to about 2.5, such as about 2. Minimizing the thicknesses of the channel layers and the sacrificial layers and using the above-described thicknesses allows for shorter channels to be formed for n-type devices and p-type devices, which improves device performance.

As will be discussed in greater detail below, including the channel layers and the sacrificial layers having the prescribed thicknesses further allows for a high-k dielectric (such as the gate dielectric layers 96, discussed below with respect to FIGS. 16A-16D) to fill gaps left by removing the sacrificial layers and allows for both the high-k dielectric and a gate electrode (such as the gate electrodes 98, discussed below with respect to FIGS. 16A-16D) to fill gaps left by removing the channel layers. The high-k dielectric is used to isolate subsequently formed source/drain regions (such as the epitaxial source/drain regions 90, discussed below with respect to FIGS. 11A-11D) and the channel layers from the substrate 50, which reduces leakage, prevents latch-up, improves performance, and reduces defects in completed semiconductor devices.

Figure 3:
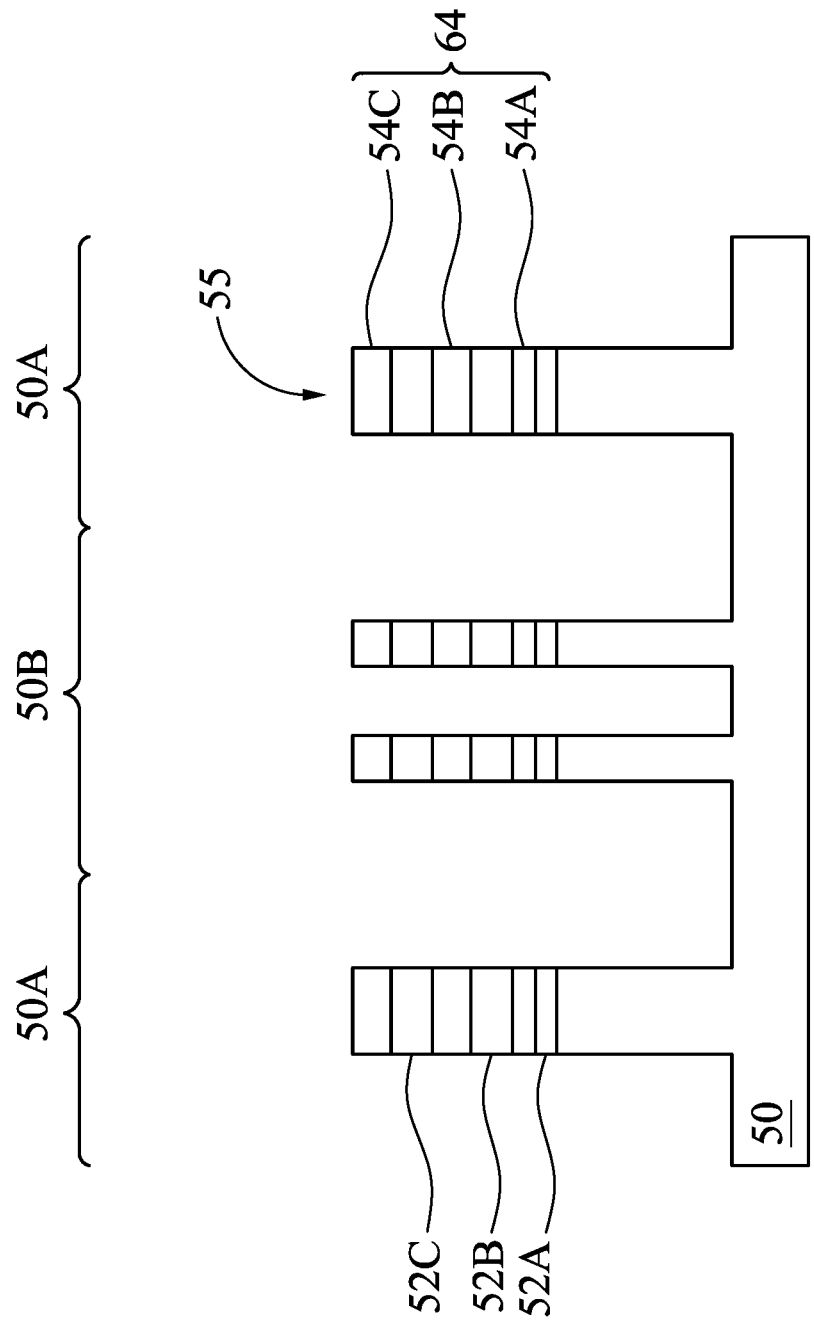

In FIG. 3, nanostructures 55 are formed in the multi-layer stack 64 and the substrate 50. The nanostructures 55 may be semiconductor strips. In some embodiments, the nanostructures 55 may be formed in the multi-layer stack 64 and the substrate 50 by etching trenches in the multi-layer stack 64 and the substrate 50. The etching may be any acceptable etch process, such as a reactive ion etch (RIE), neutral beam etch (NBE), the like, or a combination thereof. The etching may be anisotropic.

The nanostructures 55 may be patterned by any suitable method. For example, the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructures 55.

As illustrated in FIG. 3, the nanostructures 55 in the regions 50A may have widths greater than widths of the nanostructures 55 in the regions 50B. For example, the nanostructures 55 in the regions 50A may have widths from about 8 nm to about 50 nm, such as about 36 nm. The nanostructures 55 in the region 50B may have widths from about 8 nm to about 50 nm, such as about 10 nm. A ratio of the widths of the nanostructures 55 in the regions 50A to the widths of the nanostructures 55 in the regions 50B may be from about 3 to about 6, such as about 3.6. Including wider nanostructures 55 in the regions 50A and narrower nanostructures 55 in the region 50B allows for smaller semiconductor devices to be formed in the region 50B, while including strong transistors in the regions 50A, which provides for devices having improved performance and reduced size. In further embodiments, the nanostructures 55 in the regions 50B may have widths greater than or equal to widths of the nanostructures 55 in the regions 50A.

Figure 4:
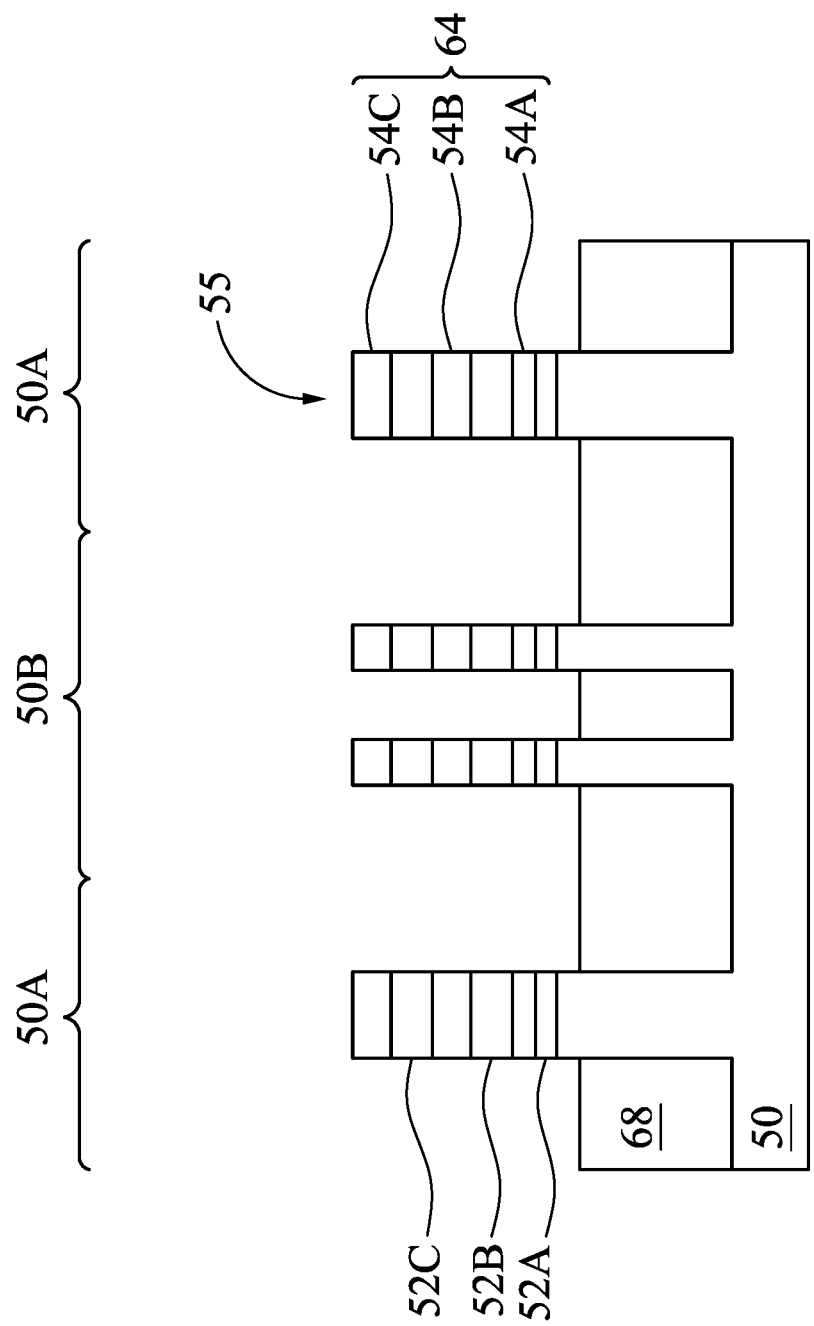

In FIG. 4, shallow trench isolation (STI) regions 68 are formed adjacent the nanostructures 55. The STI regions 68 may be formed by depositing an insulation material over the substrate 50 and the nanostructures 55 and between the nanostructures 55. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50 and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of nanostructures 55 in the regions 50A and the region 50B protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the nanostructures 55). For example, an oxide removal using, for example, dilute hydrofluoric (dHF) acid may be used.

The process described with respect to FIGS. 2 through 4 is just one example of how the nanostructures 55 may be formed. In some embodiments, the nanostructures 55 may be formed by an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and subsequent implantations although in situ and implantation doping may be used together.

Further in FIG. 4, appropriate wells (not separately illustrated) may be formed in the nanostructures 55 and/or the substrate 50. In some embodiments, wells having opposite conductivities from the regions 50A and the region 50B may be formed in the regions 50A and the region 50B, respectively. P wells or N wells may be formed in any of the regions 50A and the region 50B. As will be discussed in further detail below with respect to FIGS. 16A-16D, dielectric layers (such as the gate dielectric layers 96, discussed below with respect to FIGS. 16A-16D) may be formed between source/drain regions (such as the epitaxial source/drain regions 90, discussed below with respect to FIGS. 11A-11D) and the substrate 50 to isolate the source/drain regions from the substrate 50. The wells may be used to prevent leakage from the source/drain regions to the substrate 50. Providing the dielectric layers between the source/drain regions and the substrate 50 may allow for the wells to be obviated.

In embodiments with different well types, different implant steps for the regions 50A and the region 50B may be achieved using a photoresist or other masks (not separately illustrated). For example, a photoresist may be formed over the nanostructures 55 and the STI regions 68 in the regions 50A. The photoresist is patterned to expose the region 50B of the substrate 50. The photoresist can be formed by using a spin-on technique and can be patterned using acceptable photolithography techniques. Once the photoresist is patterned, an n-type impurity implant or a p-type impurity implant is performed in the region 50B, and the photoresist may act as a mask to substantially prevent n-type impurities or p-type impurities from being implanted into the regions 50A. N-type impurities may be phosphorus, arsenic, antimony, or the like and p-type impurities may be boron, boron fluoride, indium, or the like. The impurities may be implanted in the region to a concentration of equal to or less than $1 \times 10^{14}$ atoms/cm$^3$, such as from about $1 \times 10^{13}$ atoms/cm$^3$ to about $1 \times 10^{14}$ atoms/cm$^3$. After the implant, the photoresist is removed, such as by an acceptable ashing process.

Following the implanting of the region 50B, a photoresist is formed over the nanostructures 55 and the STI regions 68 in the region 50B. The photoresist is patterned to expose the regions 50A of the substrate 50. The photoresist can be formed by using a spin-on technique and can be patterned using acceptable photolithography techniques. Once the photoresist is patterned, an n-type impurity implant or a p-type impurity implant opposite the implant performed in the region 50B may be performed in the regions 50A, and the photoresist may act as a mask to substantially prevent n-type impurities or p-type impurities from being implanted into the region 50B. N-type impurities may be phosphorus, arsenic, antimony, or the like and p-type impurities may be boron, boron fluoride, indium, or the like. The impurities may be implanted in the region to a concentration of equal to or less than $1 \times 10^{14}$ atoms/cm$^3$, such as from about $1 \times 10^{13}$ atoms/cm$^3$ to about $1 \times 10^{14}$ atoms/cm$^3$. After the implant, the photoresist is removed, such as by an acceptable ashing process.

After the implants of the regions 50A and the region 50B, an anneal may be performed to repair implant damage and to activate the p-type and/or n-type impurities that were implanted. In some embodiments, the grown materials of epitaxial nanostructures may be in situ doped during growth, which may obviate the implantations, although in situ and implantation doping may be used together.

Figure 5:
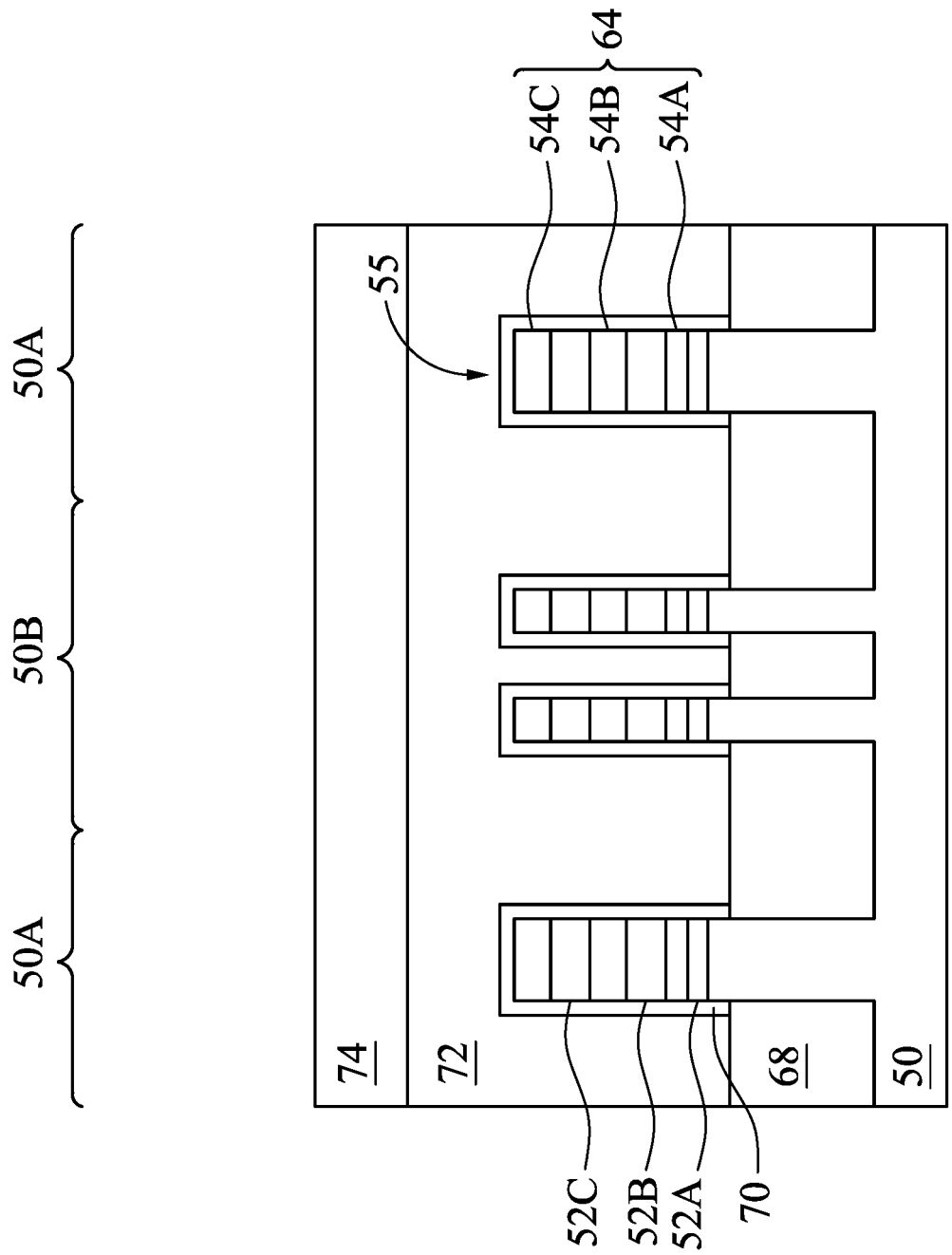

In FIG. 5, a dummy dielectric layer 70 is formed on the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (poly-silicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques known and used in the art for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the regions 50A and the region 50B. It is noted that the dummy dielectric layer 70 is shown covering only the fins 66 for illustrative purposes only. In some embodiments, the dummy dielectric layer 70 may be deposited such that the dummy dielectric layer 70 covers the STI regions 68, extending between the dummy gate layer 72 and the STI regions 68.

FIGS. 6A through 18C illustrate various additional steps in the manufacturing of embodiment devices. FIGS. 6B, 7, 11C, and 11D illustrate features in either the regions 50A or the region 50B. Specifically, the structures illustrated in FIGS. 6B and 7 may be applicable to both the regions 50A and the region 50B. The structures illustrated in FIGS. 8A, 9A, 10A, 11A, 12B, 13B, 14B, 15B, 16B, 17B, and 18B illustrate features in the regions 50A. The structures illustrated in FIGS. 8B, 9B, 10B, 11B, 12C, 13C, 14C, 15C, 16C, 17C, and 18C illustrate features in the region 50B. The structures illustrated in FIGS. 6A, 12A, 13A, 14A, 15A, 16A, 16D, 17A, and 18A illustrate features in both the regions 50A and the region 50B. Any differences in the structures of the regions 50A and the region 50B are described in the text accompanying each figure.

Figure 6A:
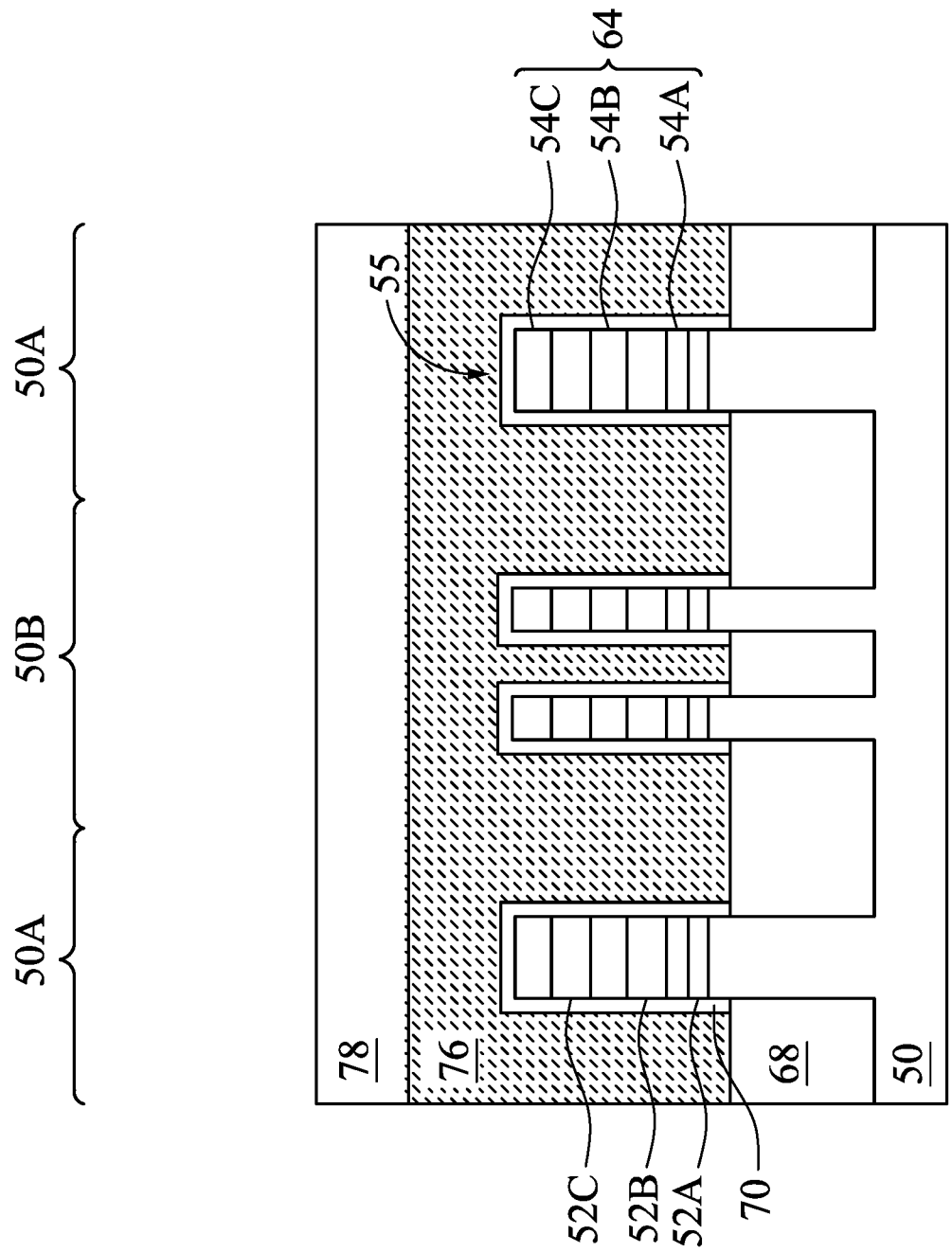
Figure 6B:
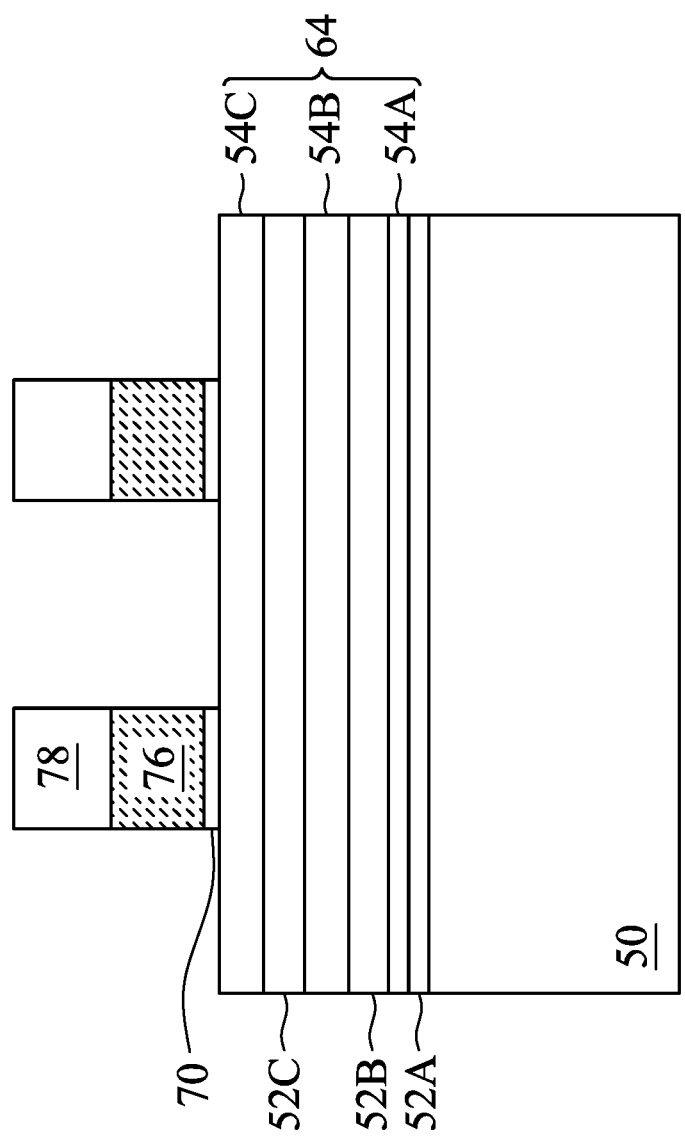
Figure 7:
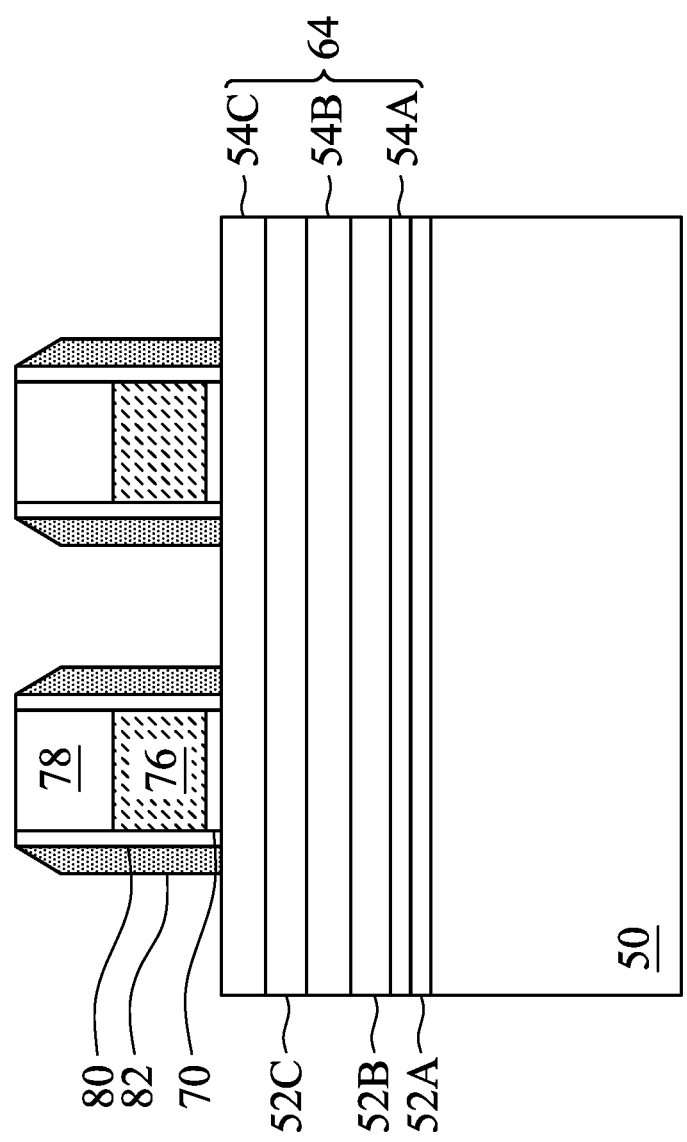

In FIGS. 6A and 6B, the mask layer 74 (see FIG. 5) may be patterned using acceptable photolithography and etching techniques to form masks 78. The pattern of the masks 78 then may be transferred to the dummy gate layer 72. In some embodiments (not separately illustrated), the pattern of the masks 78 may also be transferred to the dummy dielectric layer 70 by an acceptable etching technique to form dummy gates 76. The dummy gates 76 cover respective channel regions of the nanostructures 55. The pattern of the masks 78 may be used to physically separate each of the dummy gates 76 from adjacent dummy gates 76. The dummy gates 76 may also have a lengthwise direction substantially perpendicular to the lengthwise direction of respective nanostructures 55.

In FIG. 7, gate seal spacers 80 are be formed on exposed surfaces of the dummy gates 76, the masks 78, and/or the nanostructures 55. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not separately illustrated) may be performed. In the embodiments with different device types, similar to the implants discussed above in FIG. 4, a mask, such as a photoresist, may be formed over the regions 50A, while exposing the region 50B, and appropriate type impurities (e.g., impurities having the same conductivity type as the region 50B) may be implanted into the exposed nanostructures 55 in the region 50B. The mask may then be removed. Subsequently, a mask, such as a photoresist, may be formed over the region 50B while exposing the regions 50A, and appropriate type impurities (e.g., impurities having the same conductivity type as the region 50A) may be implanted into the exposed nanostructures 55 in the regions 50A. The mask may then be removed. The n-type impurities may be any of the n-type impurities previously discussed, and the p-type impurities may be any of the p-type impurities previously discussed. The lightly doped source/drain regions may have a concentration of impurities of from about $1 \times 10^{15}$ atoms/cm$^3$ to about $1 \times 10^{19}$ atoms/cm$^3$. An anneal may be used to repair implant damage and to activate the implanted impurities.

Further in FIG. 7, gate spacers 82 are formed on the gate seal spacers 80 along sidewalls of the dummy gates 76 and the masks 78. The gate spacers 82 may be formed by conformally depositing an insulating material and subsequently anisotropically etching the insulating material. The insulating material of the gate spacers 82 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 82, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 8A:
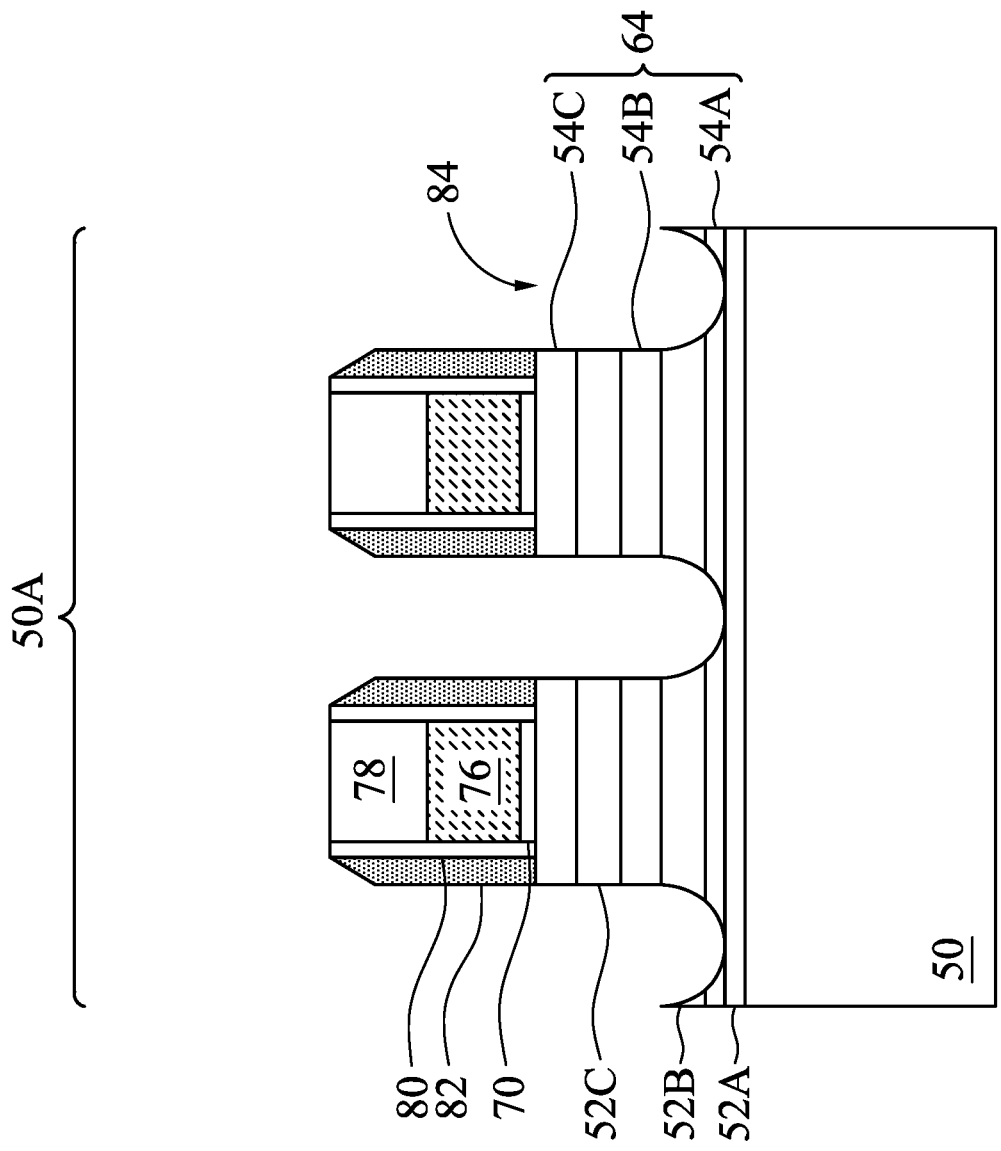
Figure 8B:
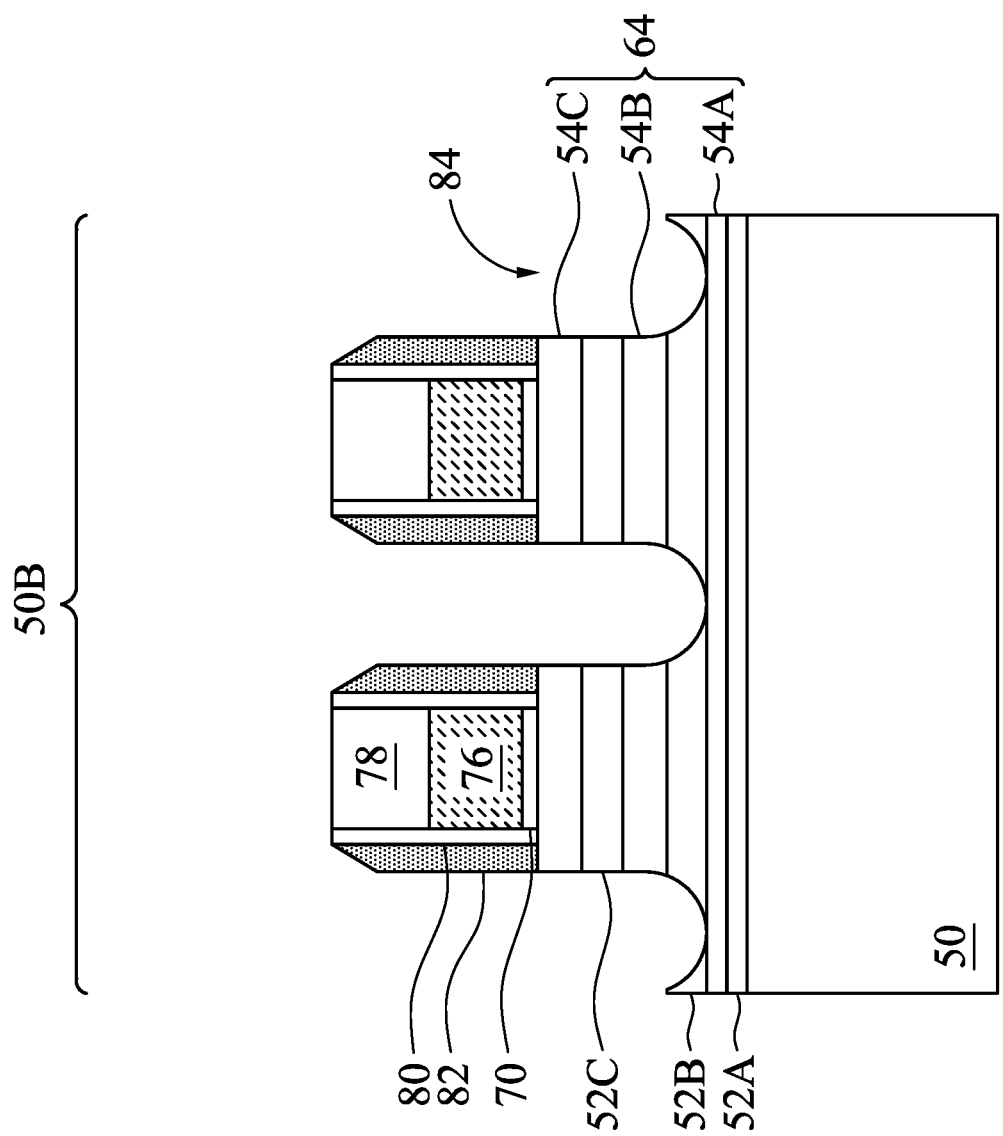

In FIGS. 8A and 8B, recesses 84 are formed in the nanostructures 55 in the regions 50A and the region 50B. As illustrated in FIG. 8A, the recesses 84 in the regions 50A extend through the first semiconductor layers 52B and 52C and the second semiconductor layers 54A-54C, exposing the first semiconductor layer 52A. The first semiconductor layer 52A continuously extends under the recesses 84, the first semiconductor layers 52B and 52C, and the second semiconductor layers 54A-C in the region 50A. As illustrated in FIG. 8B, the recesses 84 in the region 50B extend through the first semiconductor layers 52B and 52C and the second semiconductor layers 54B and 54C, exposing the second semiconductor layer 54A. The second semiconductor layer 54A continuously extends under the recesses 84, the first semiconductor layers 52B and 52C, and the second semiconductor layers 54B and 54C in the region 50B.

The recesses 84 may be formed by etching the nanostructures 55 using anisotropic etching processes, such as RIE, NBE, or the like. The gate spacers 82, the gate seal spacers 80, and the masks 78 mask portions of the nanostructures 55 during the etching processes used to form the recesses 84. A single etch process may be used to etch each of the first semiconductor layers 52B and 52C and the second semiconductor layers 54A-54C. In other embodiments, multiple etch processes may be used to etch the layers of the multi-layer stack 64. Timed etch processes may be used to stop the etching of the recesses 84 after etching the second semiconductor layer 54A in the regions 50A and after etching the first semiconductor layer 52B in the regions 50B. The recesses 84 in the regions 50A may be etched to depths from about 40 nm to about 50 nm, such as about 45 nm and the recesses 84 in the region 50B may be etched to depths from about 30 nm to about 40 nm, such as about 35 nm. The etching may be performed using a plasma formed from a process gas such as trifluoromethane ($CHF_3$), tetrafluoromethane ($CF_4$), hydrogen bromide (HBr), or the like.

In the embodiments in which the recesses 84 have different depths in the regions 50A and the region 50B, respectively, photoresists or other masks (not separately illustrated) may be used during the etch processes which form the recesses 84. A mask, such as a photoresist, may be formed over the regions 50A, while etching the region 50B. The mask may then be removed. Subsequently, a mask, such as a photoresist, may be formed over the region 50B while etching the regions 50A. The mask may then be removed.

Figure 9A:
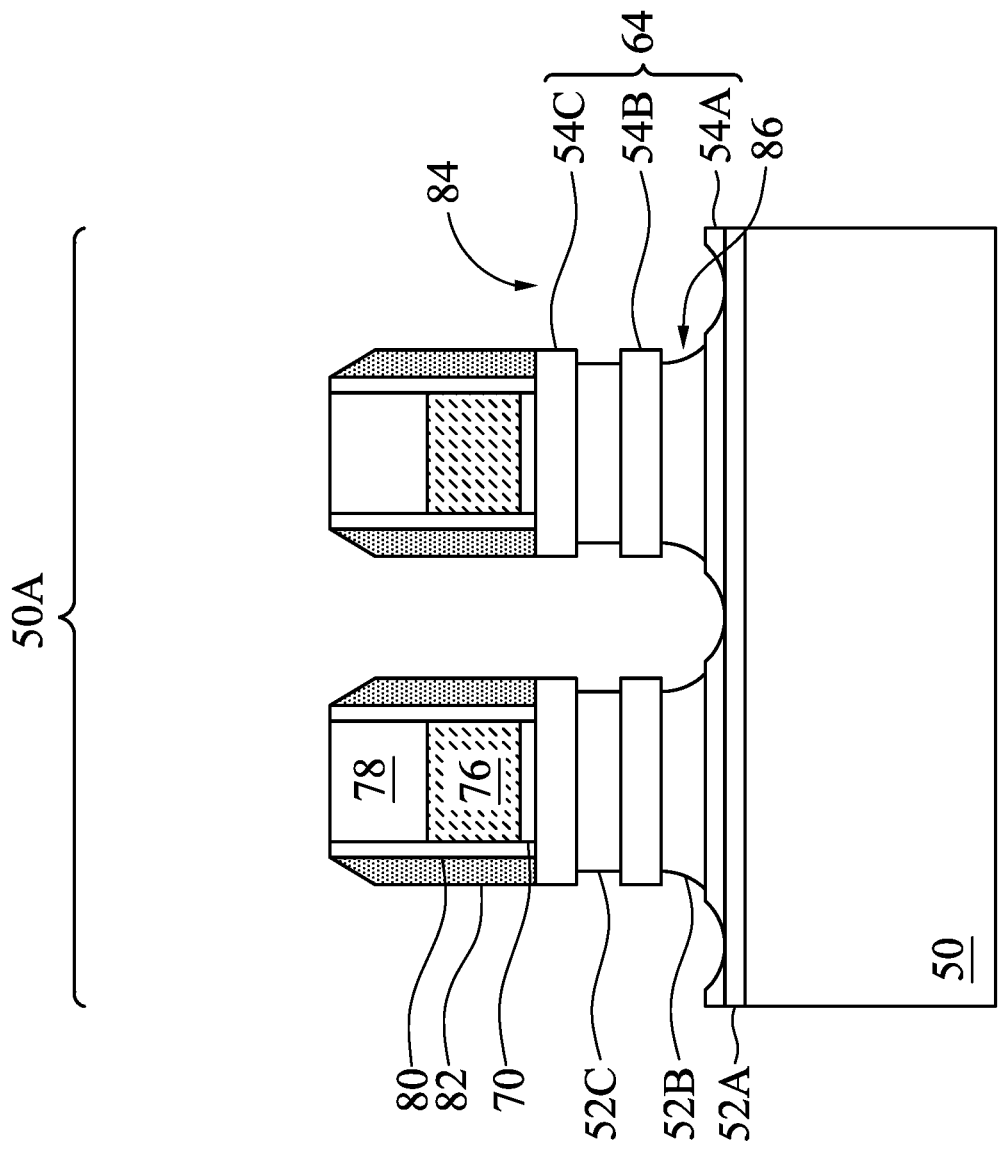
Figure 9B:
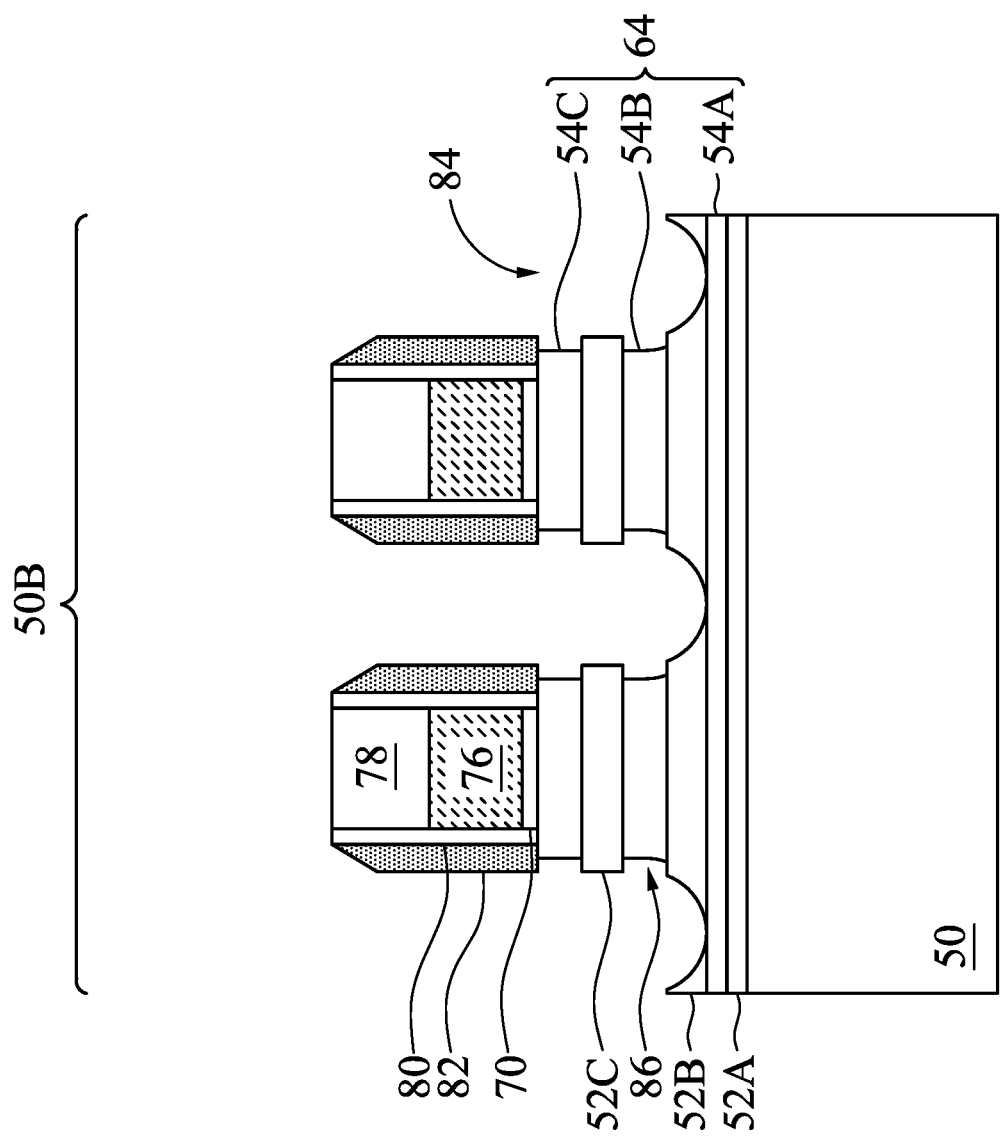

In FIGS. 9A and 9B, portions of the sidewalls of the layers of the multi-layer stack 64 exposed by the recesses 84 are etched to form sidewall recesses 86. The sidewalls may be etched using isotropic etching processes, such as wet etching or the like. As illustrated in FIG. 9A, sidewalls of the first semiconductor layers 52B and 52C may be etched in the regions 50A. As illustrated in FIG. 9B, sidewalls of the second semiconductor layers 54B and 54C may be etched in the region 50B. The different layers may be etched in the regions 50A and the region 50B by using a photoresist or other masks (not separately illustrated). A mask, such as a photoresist, may be formed over the regions 50A, while etching the region 50B. The mask may then be removed. Subsequently, a mask, such as a photoresist, may be formed over the region 50B while etching the regions 50A. The mask may then be removed.

The etchants used to etch the first semiconductor layers 52B and 52C may be selective to the materials of the second semiconductor layers 54A-54C, while the etchants used to etch the second semiconductor layers 54B and 54C may be selective to the materials of the first semiconductor layers 52A-52C. In an embodiment in which the first semiconductor layers 52A-52C comprise the first semiconductor material (e.g., SiGe or the like) and the second semiconductor layers 54A-54C comprise the second semiconductor material (e.g., Si, SiC, or the like), tetramethylammonium hydroxide (TMAH), ammonium hydroxide ($NH_4OH$), or the like may be used to etch sidewalls of the multi-layer stack 64 in the regions 50A and diluted ammonium hydroxide-hydrogen peroxide mixture (APM), sulfuric acid-hydrogen peroxide mixture (SPM), or the like may be used to etch sidewalls of the multi-layer stack 64 in the region 50B.

In further embodiments, the layers may be etched using a dry etching process. Hydrogen fluoride, another fluorine-based gas, or the like may be used to etch sidewalls of the multi-layer stack 64 in the regions 50A and hydrogen ($H_2$) plasma, trifluoromethane ($CHF_3$)/oxygen ($O_2$)/hydrogen ($H_2$) plasma, combinations thereof, or the like may be used to etch sidewalls of the multi-layer stack 64 in the region 50B. Although the first semiconductor layers 52B and 52C and the second semiconductor layers 54B and 54C are illustrated in FIGS. 9A and 9B as having linear sidewalls adjacent the sidewall recesses 86, the sidewalls may be concave, convex, or the like. Moreover, sidewalls of each of the first semiconductor layers 52B and 52C and the second semiconductor layers 54B and 54C may extend beyond, be recessed from, or be co-terminus with sidewalls of adjacent channel layers and/or sacrificial layers.

Figure 10A:
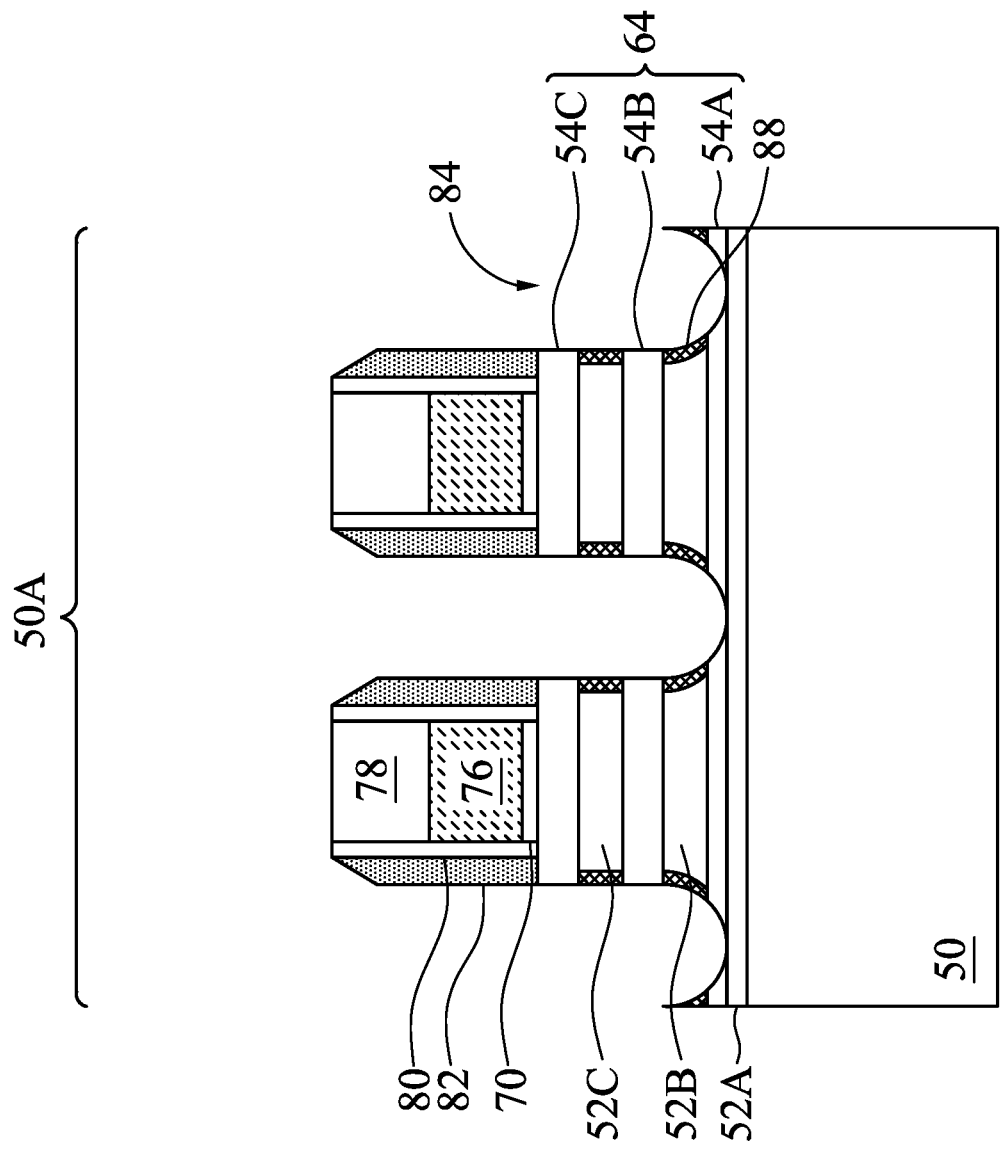
Figure 10B:
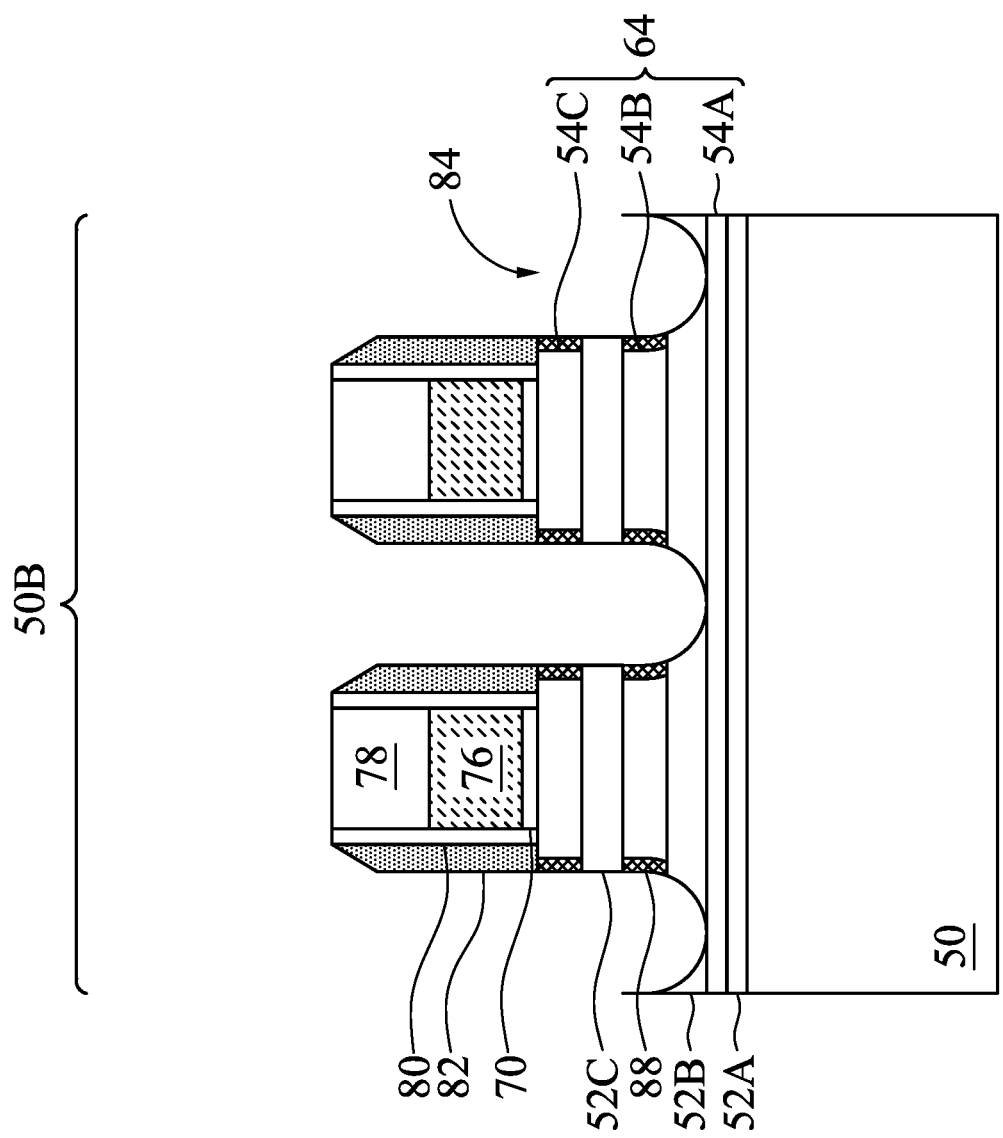

In FIGS. 10A and 10B, inner spacers 88 are formed in the sidewall recess 86. The inner spacers 88 may be formed by depositing an inner spacer layer over the structures illustrated in FIGS. 9A and 9B. The inner spacer layer may be deposited by a conformal deposition process, such as CVD, ALD, or the like. The inner spacer layer may comprise a material such as silicon nitride or silicon oxynitride, although any suitable material, such as low-k materials having a k-value less than about 3.5, may be utilized.

The inner spacer layer may then be etched to form the inner spacers 88. The inner spacer layer may be etched by an anisotropic etching process, such as RIE, NBE, or the like. The inner spacers 88 may be used to prevent damage to subsequently formed source/drain regions (such as the epitaxial source/drain regions 90, discussed below with respect to FIGS. 11A and 11B) by subsequent etching processes. Although the inner spacers 88 are illustrated as having linear sidewalls, the sidewalls of the inner spacers 88 may be convex, concave, or the like. Moreover, sidewalls of the inner spacers 88 adjacent the recesses 84 may extend beyond, be recessed from, or be co-terminus with sidewalls of the channel layers and/or sacrificial layers disposed adjacent and above or below the inner spacers 88.

In FIGS. 11A-11D epitaxial source/drain regions 90 are formed in the recesses 84 in the regions 50A and the region 50B to exert stress in the channel layers (e.g., the first semiconductor layers 52B and 52C and the second semiconductor layers 54B and 54C) of the multi-layer stack 64, thereby improving performance. The epitaxial source/drain regions 90 are formed in the recesses 84 such that each dummy gate 76 is disposed between respective neighboring pairs of the epitaxial source/drain regions 90. The first semiconductor layer 52A extends continuously below the epitaxial source/drain regions 90, between the epitaxial source/drain regions 90 and the substrate 50 in the region 50A. The second semiconductor layer 54A extends continuously below the epitaxial source/drain regions 90, between the epitaxial source/drain regions 90 and the substrate 50 in the region 50B. In some embodiments, the gate spacers 82 are used to separate the epitaxial source/drain regions 90 from the dummy gates 76 by an appropriate lateral distance so that the epitaxial source/drain regions 90 do not short out subsequently formed gates of the resulting NSFETs. The inner spacers 88 may also be used to separate the epitaxial source/drain regions 90 from the dummy gates 76 and to prevent shorts between the epitaxial source/drain regions 90 and subsequently formed gates of the resulting NSFETs.

The epitaxial source/drain regions 90 in the regions 50A may be formed by masking the region 50B. Then, the epitaxial source/drain regions 90 are epitaxially grown in the recesses 84. The epitaxial source/drain regions 90 may include any acceptable material. For example, if the second semiconductor layers 54B and 54C are formed of the second semiconductor material (e.g., Si, SiC, or the like), the epitaxial source/drain regions 90 in the regions 50A may include materials exerting a tensile strain in the second semiconductor layers 54B and 54C, such as silicon, silicon carbide, phosphorous doped silicon carbide, silicon phosphide, or the like. The epitaxial source/drain regions 90 may have surfaces raised from respective surfaces of the multi-layer stack 64 and may have facets.

The epitaxial source/drain regions 90 in the region 50B may be formed by masking the regions 50A. Then, the epitaxial source/drain regions 90 are epitaxially grown in the recesses 84. The epitaxial source/drain regions 90 may include any acceptable material. For example, if the first semiconductor layers 52B and 52C are formed of the first semiconductor material (e.g., SiGe or the like), the epitaxial source/drain regions 90 in the region 50B may include materials exerting a compressive strain in the first semiconductor layers 52B and 52C, such as silicon-germanium, boron doped silicon-germanium, germanium, germanium tin, or the like. In embodiments in which the epitaxial source/drain regions 90, the first semiconductor layers 52B and 52C comprise silicon germanium, the epitaxial source/drain regions 90 may have a germanium concentration greater than a germanium concentration of the first semiconductor layers 52B and 52C. The epitaxial source/drain regions 90 may also have surfaces raised from respective surfaces of the multi-layer stack 64 and may have facets.

As a result of the epitaxy processes used to form the epitaxial source/drain regions 90 in the regions 50A and the region 50B, upper surfaces of the epitaxial source/drain regions 90 have facets which expand laterally outward beyond sidewalls of the nanostructures 55. In some embodiments, these facets cause adjacent epitaxial source/drain regions 90 of a same NSFET to merge as illustrated by FIG. 11C. In other embodiments, adjacent epitaxial source/drain regions 90 remain separated after the epitaxy process is completed as illustrated by FIG. 11D. In the embodiments illustrated in FIGS. 11C and 11D, gate spacers 82 and gate seal spacers 80 are formed covering a portion of the sidewalls of the nanostructures 55 that extend above the STI regions 68 thereby blocking the epitaxial growth. In some other embodiments, the spacer etch used to form the gate spacers 82 and the gate seal spacers 80 may be adjusted to remove the spacer material to allow the epitaxially grown region to extend to the surfaces of the STI regions 68.

The epitaxial source/drain regions 90 and/or the multi-layer stack 64 may be implanted with dopants to form source/drain regions, similar to the process previously discussed for forming lightly-doped source/drain regions, followed by an anneal. The source/drain regions may have an impurity concentration from about $1 \times 10^{19}$ atoms/cm$^3$ to about $1 \times 10^{21}$ atoms/cm$^3$. The n-type and/or p-type impurities for source/drain regions may be any of the impurities previously discussed. In some embodiments, the epitaxial source/drain regions 90 may be in situ doped during growth.

Although the above description has discussed using separate masks for each of the steps illustrated in FIGS. 8A-11D, the different process may be performed on the regions 50A and the region 50B using a single photoresist or other mask for the regions 50A and for the region 50B. For example, a mask, such as a photoresist, may be formed over the regions 50A, while the processes illustrated in FIGS. 8B, 9B, 10B, and 11B are performed on the region 50B. The mask may then be removed. Subsequently, a mask, such as a photoresist, may be formed over the region 50B while the processes illustrated in FIGS. 8A, 9A, 10A, and 11A are performed on the regions 50A. The mask may then be removed.

Figure 11A:
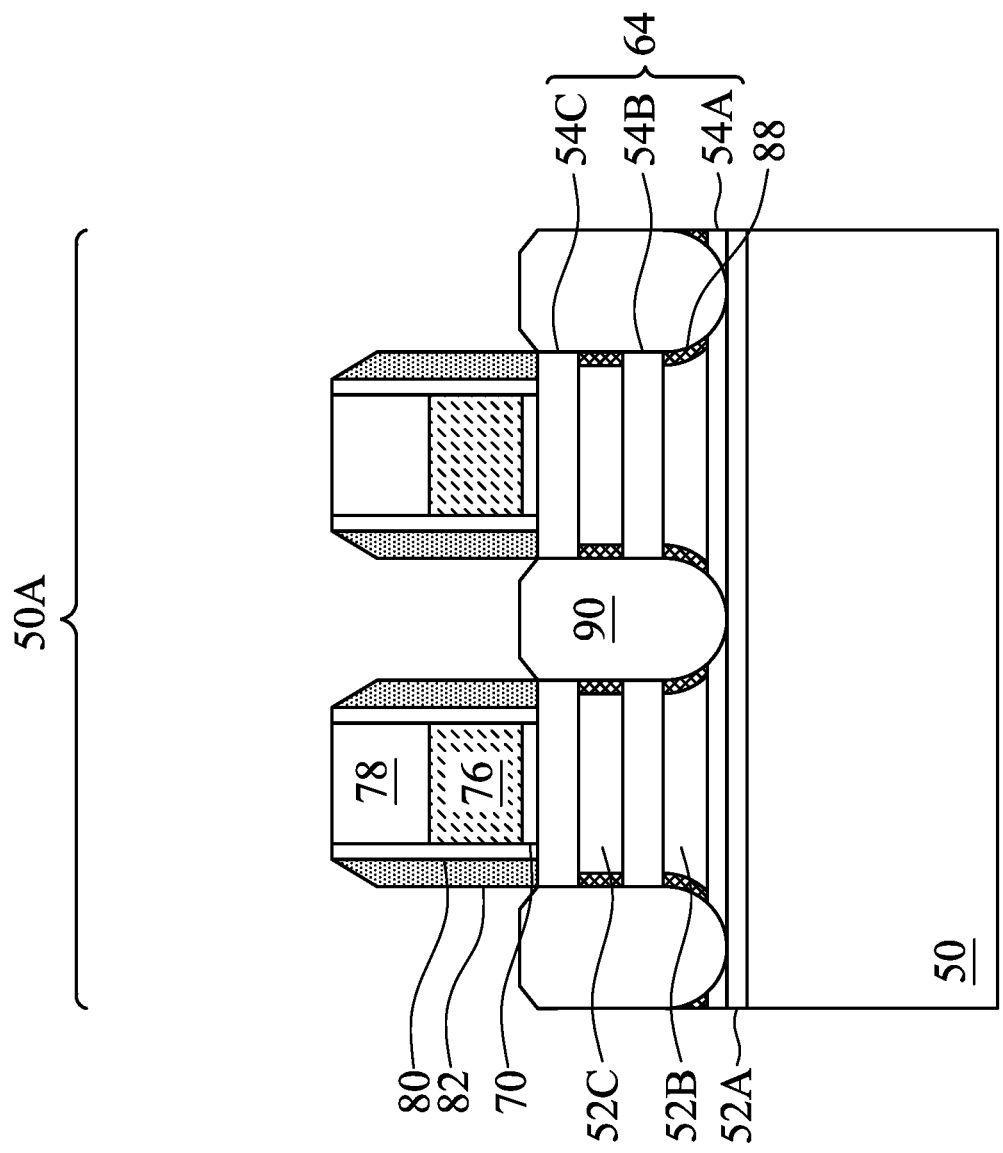
Figure 11B:
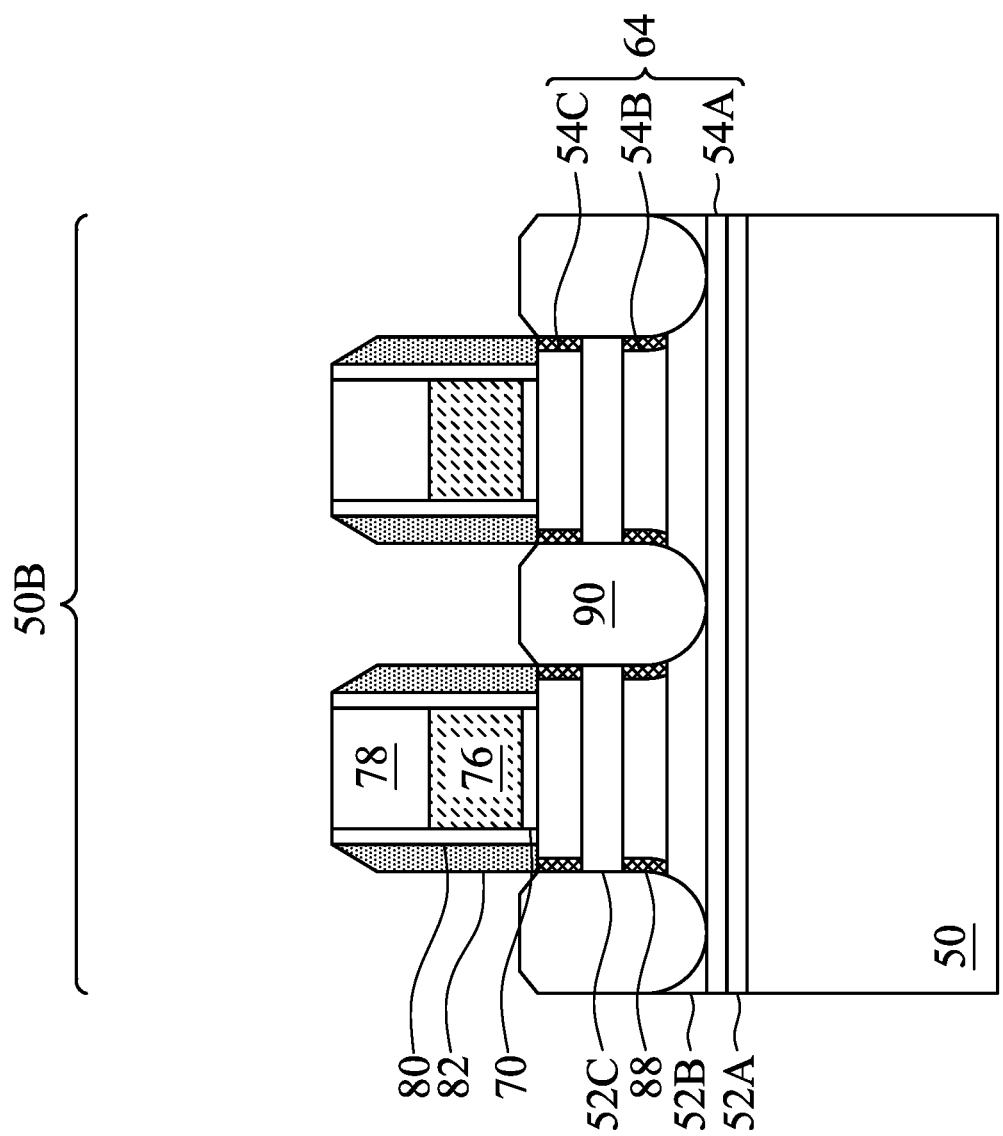
Figure 11C:
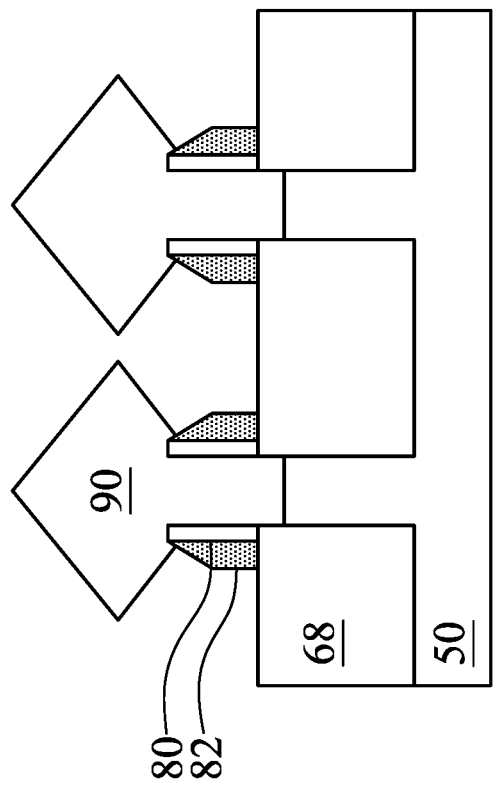
Figure 11D:
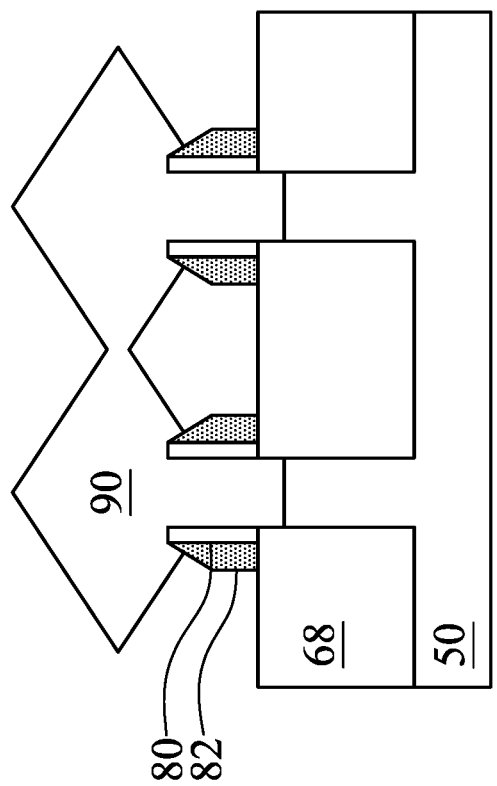
Figure 12A:
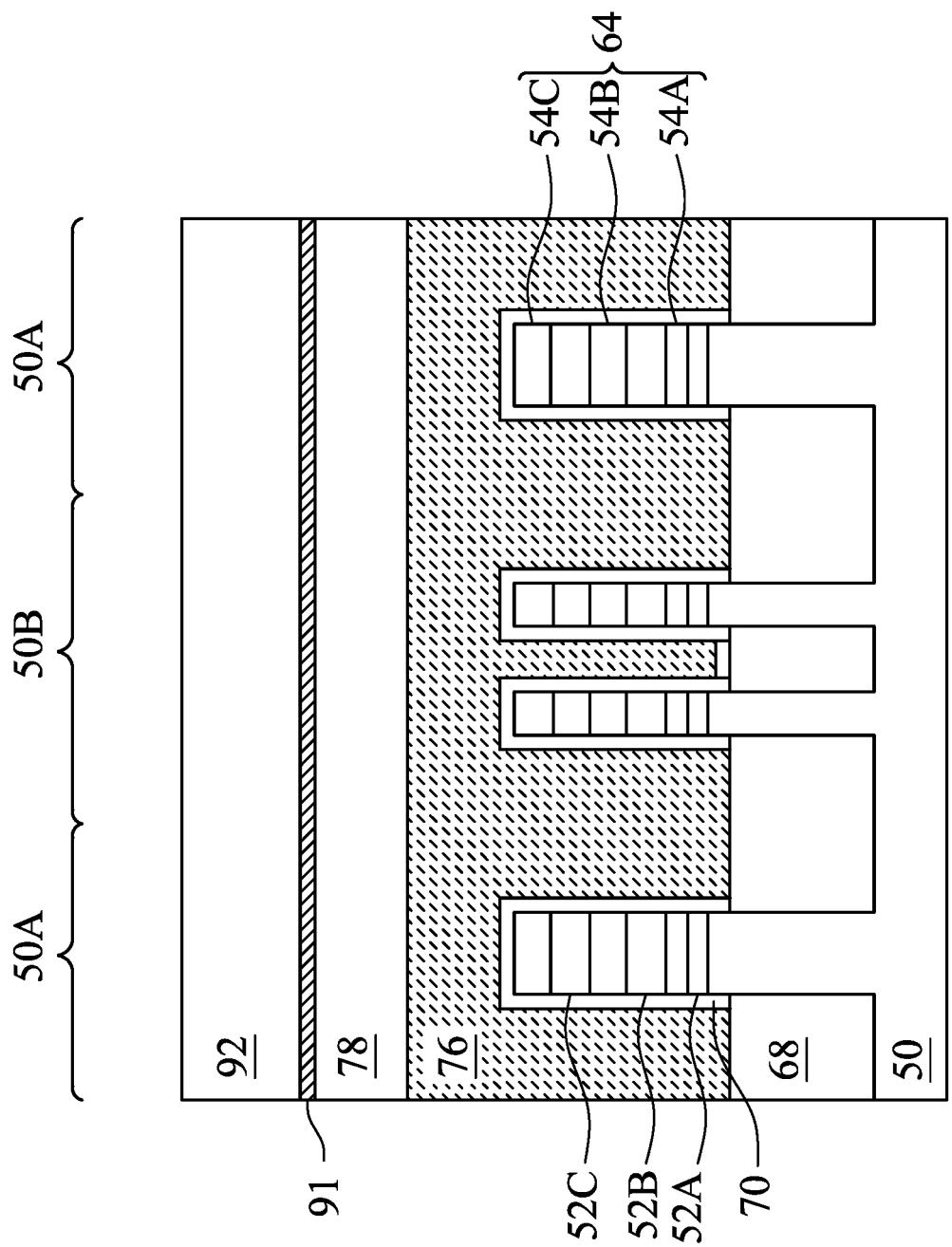
Figure 12B:
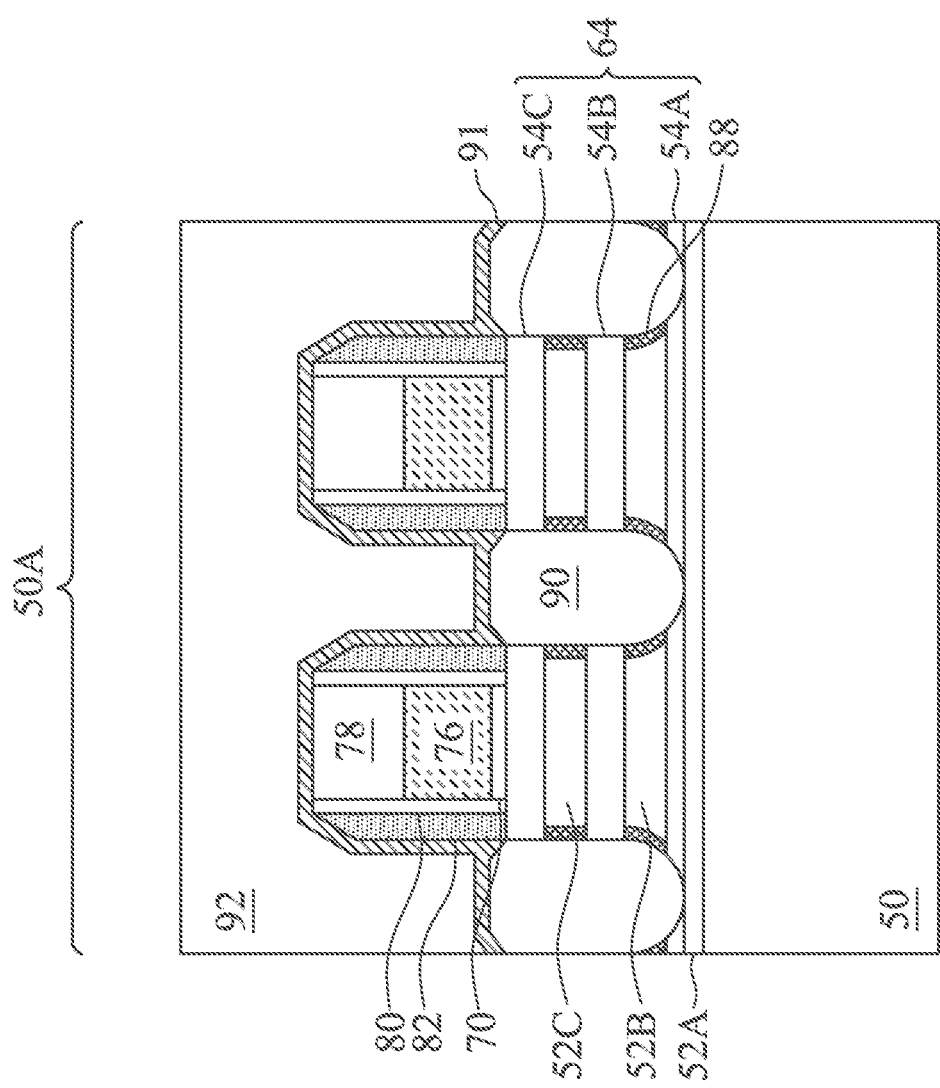
Figure 12C:
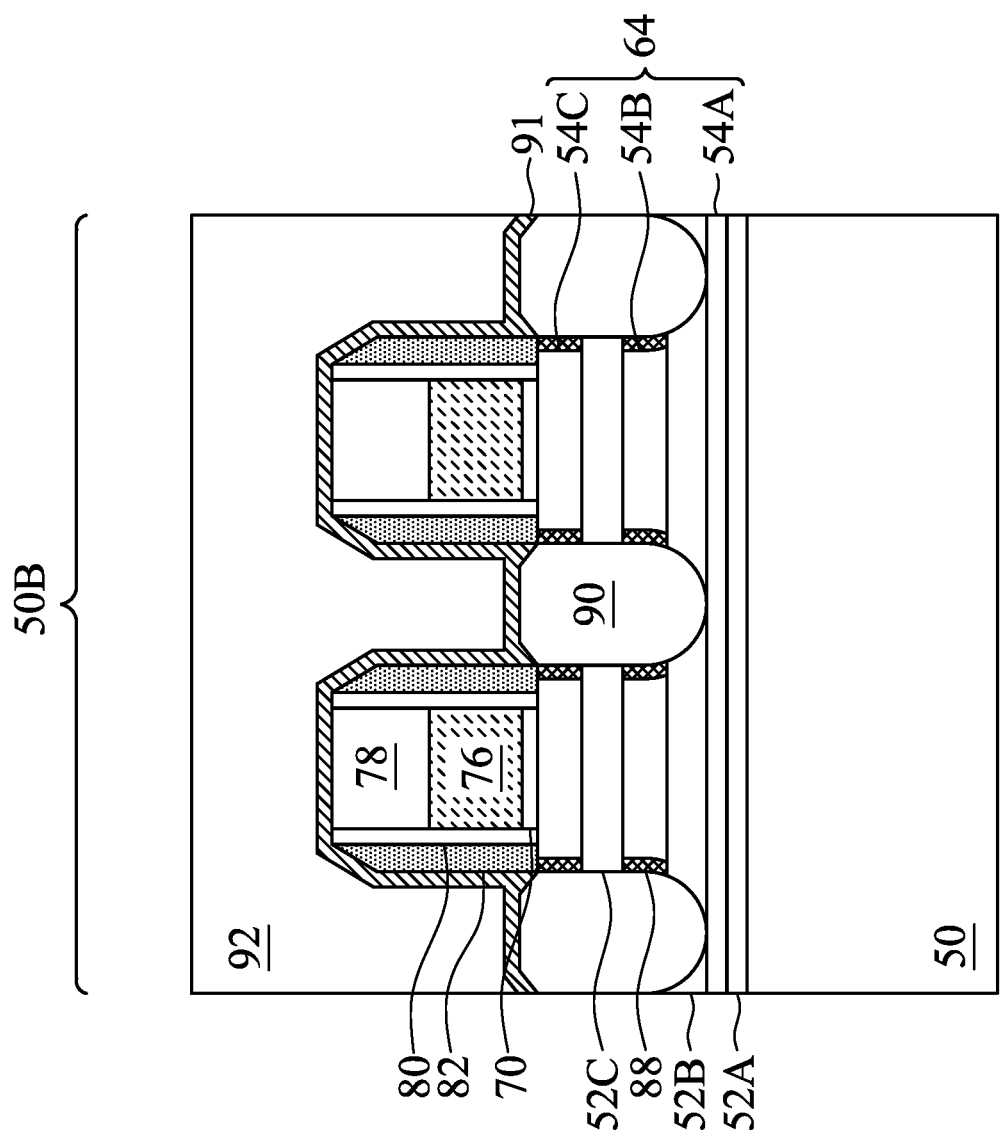

In FIGS. 12A-12C, a first interlayer dielectric (ILD) 92 is deposited over the structure illustrated in FIGS. 11A, 11B, and 6A (the processes of FIGS. 7-11B do not alter the cross-section illustrated in FIG. 6A). The first ILD 92 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 91 is disposed between the first ILD 92 and the epitaxial source/drain regions 90, the masks 78, and the gate spacers 82. The CESL 91 may comprise a dielectric material, such as, silicon nitride, silicon oxide, silicon oxynitride, or the like, having a different etch rate than the material of the overlying first ILD 92.

Figure 13A:
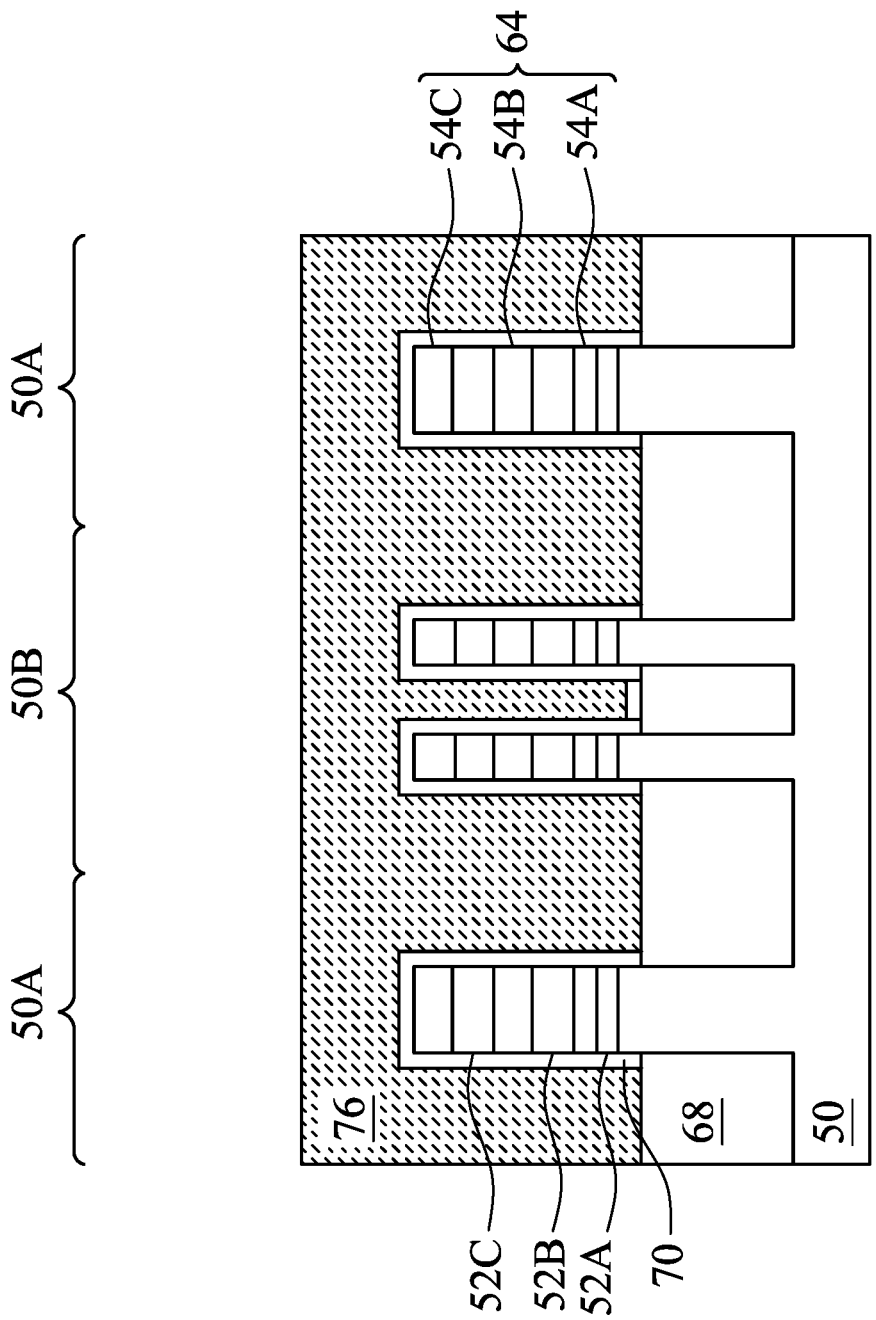
Figure 13B:
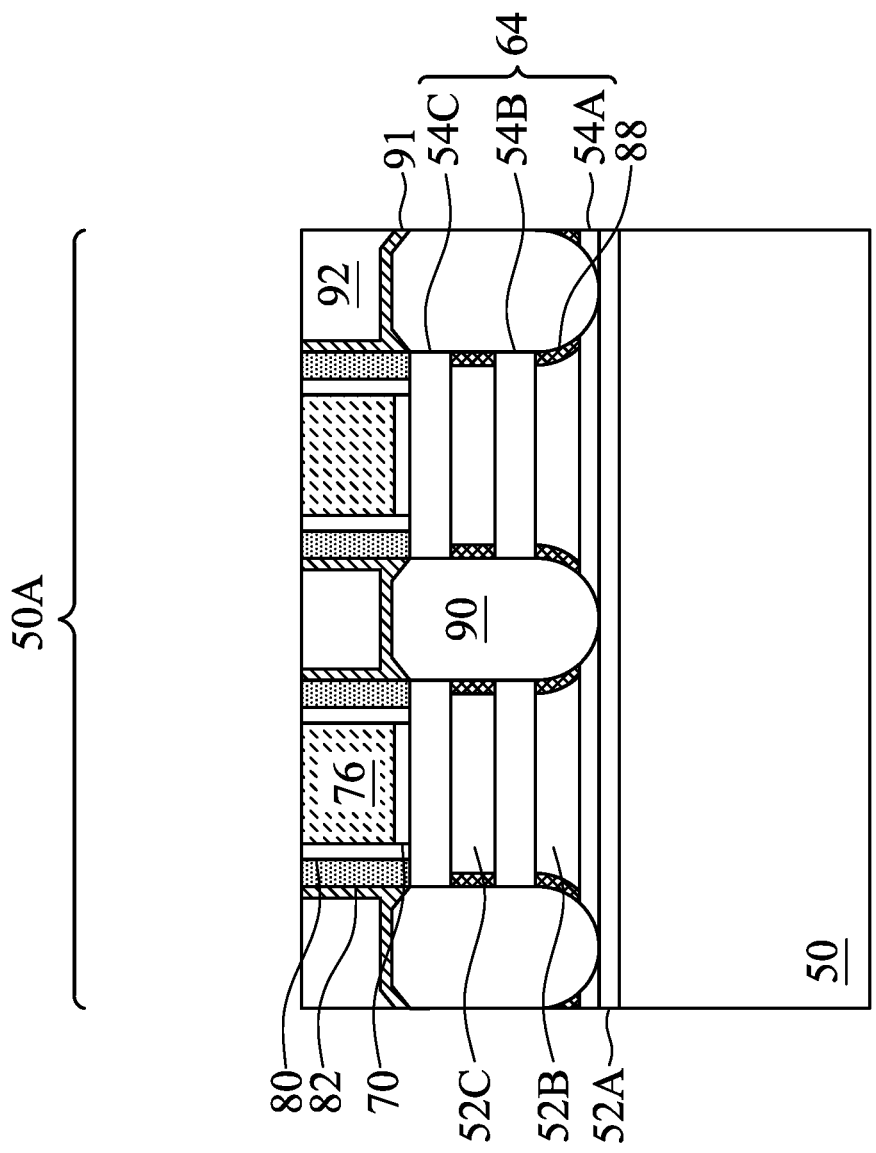
Figure 13C:
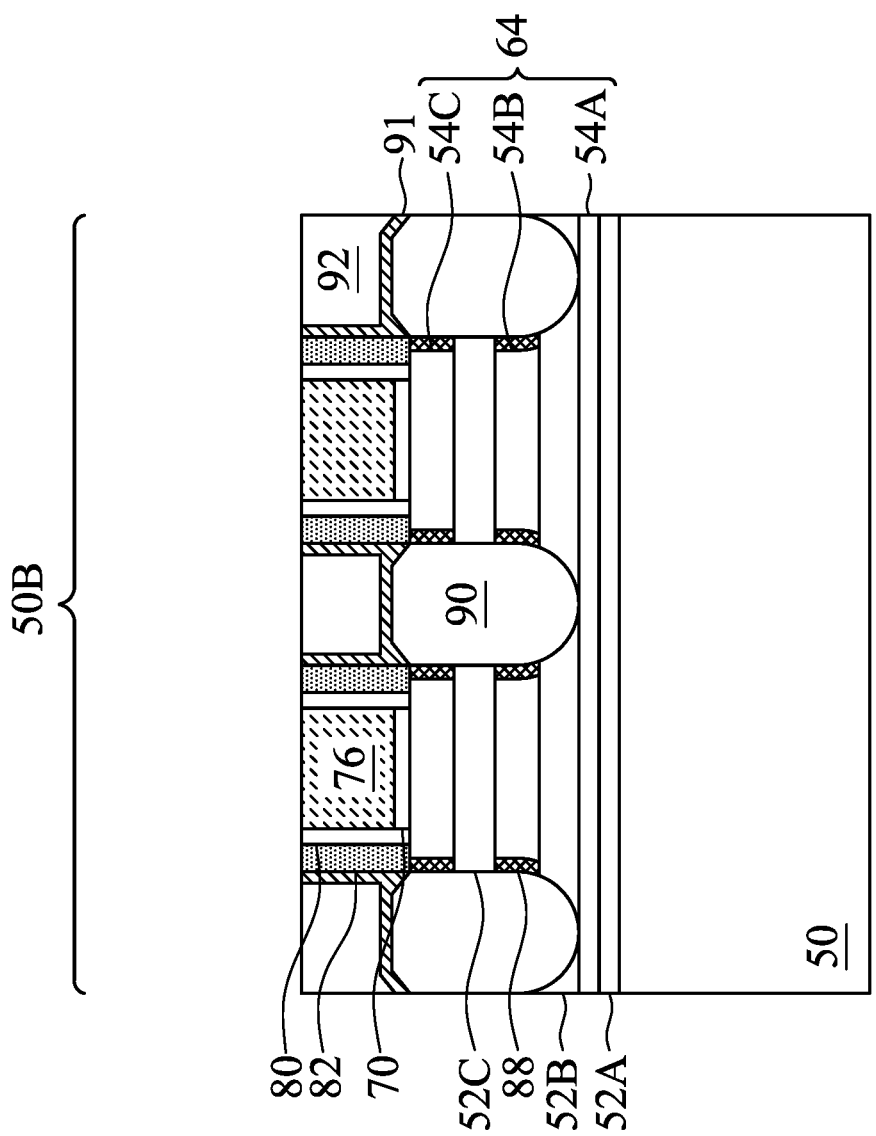

In FIGS. 13A-13C, a planarization process, such as a CMP, may be performed to level the top surface of the first ILD 92 with the top surfaces of the dummy gates 76 or the masks 78. The planarization process may also remove the masks 78 on the dummy gates 76, and portions of the gate seal spacers 80 and the gate spacers 82 along sidewalls of the masks 78. After the planarization process, top surfaces of the dummy gates 76, the gate seal spacers 80, the gate spacers 82, and the first ILD 92 are level. Accordingly, the top surfaces of the dummy gates 76 are exposed through the first ILD 92. In some embodiments, the masks 78 may remain, in which case the planarization process levels the top surface of the first ILD 92 with top surface of the masks 78, the gate seal spacers 80, and the gate spacers 82.

Figure 14A:
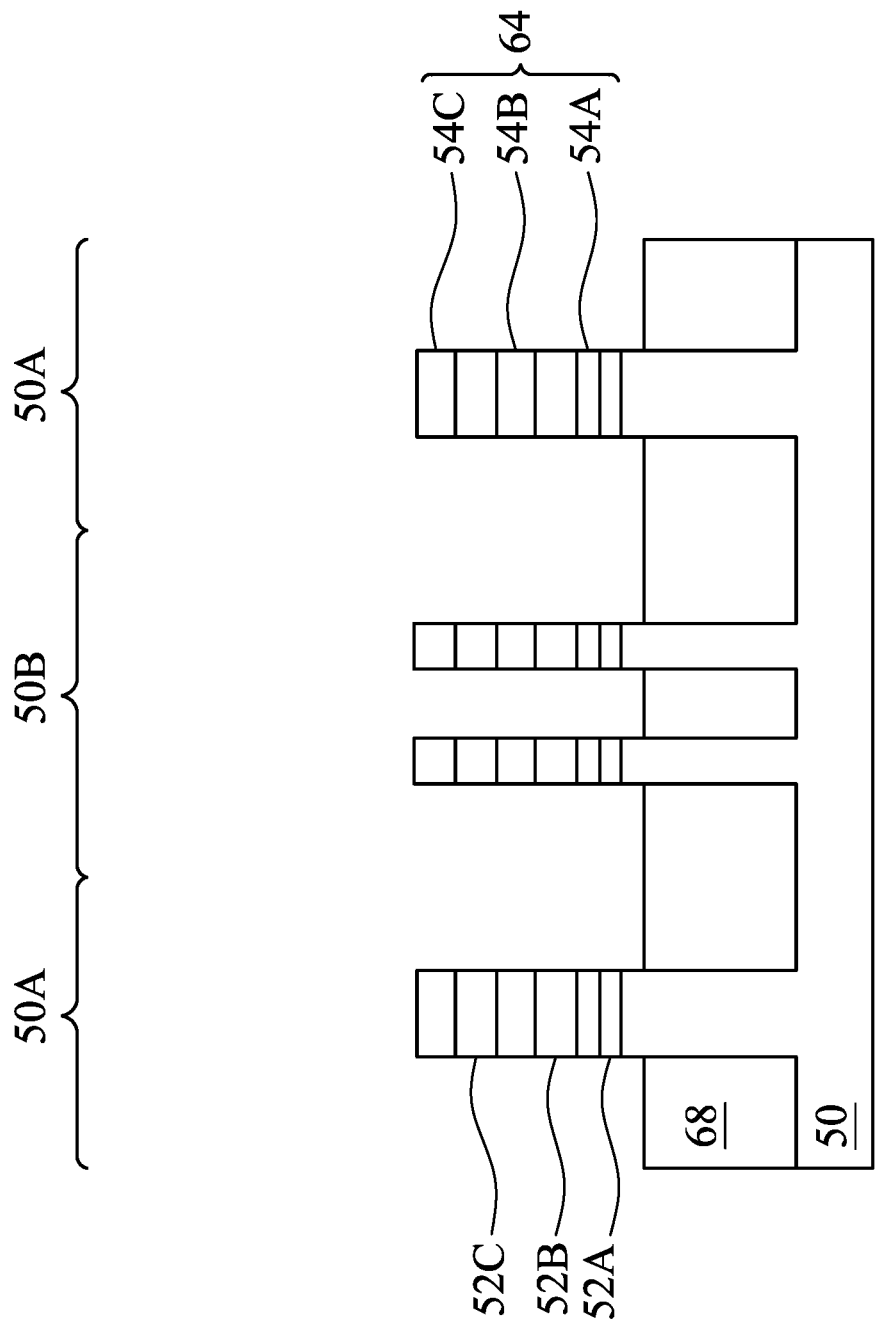
Figure 14B:
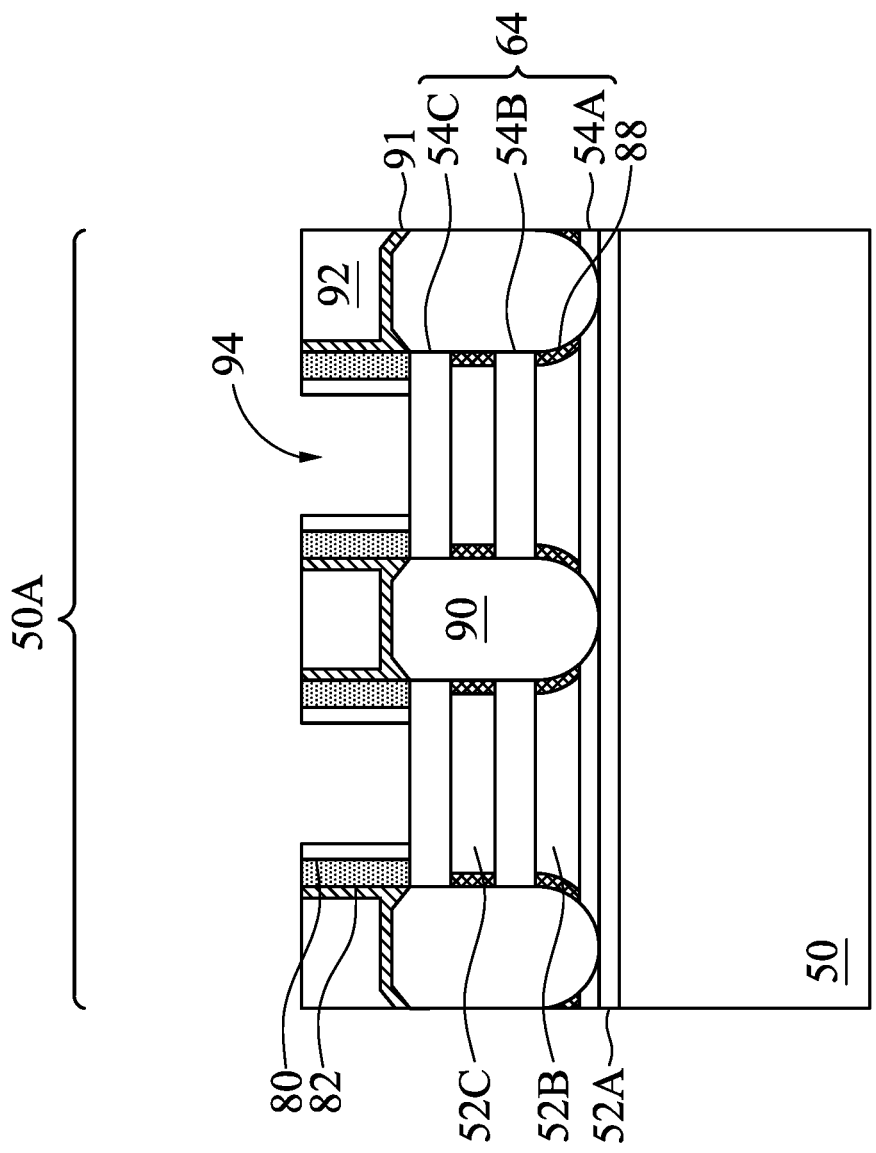
Figure 14C:
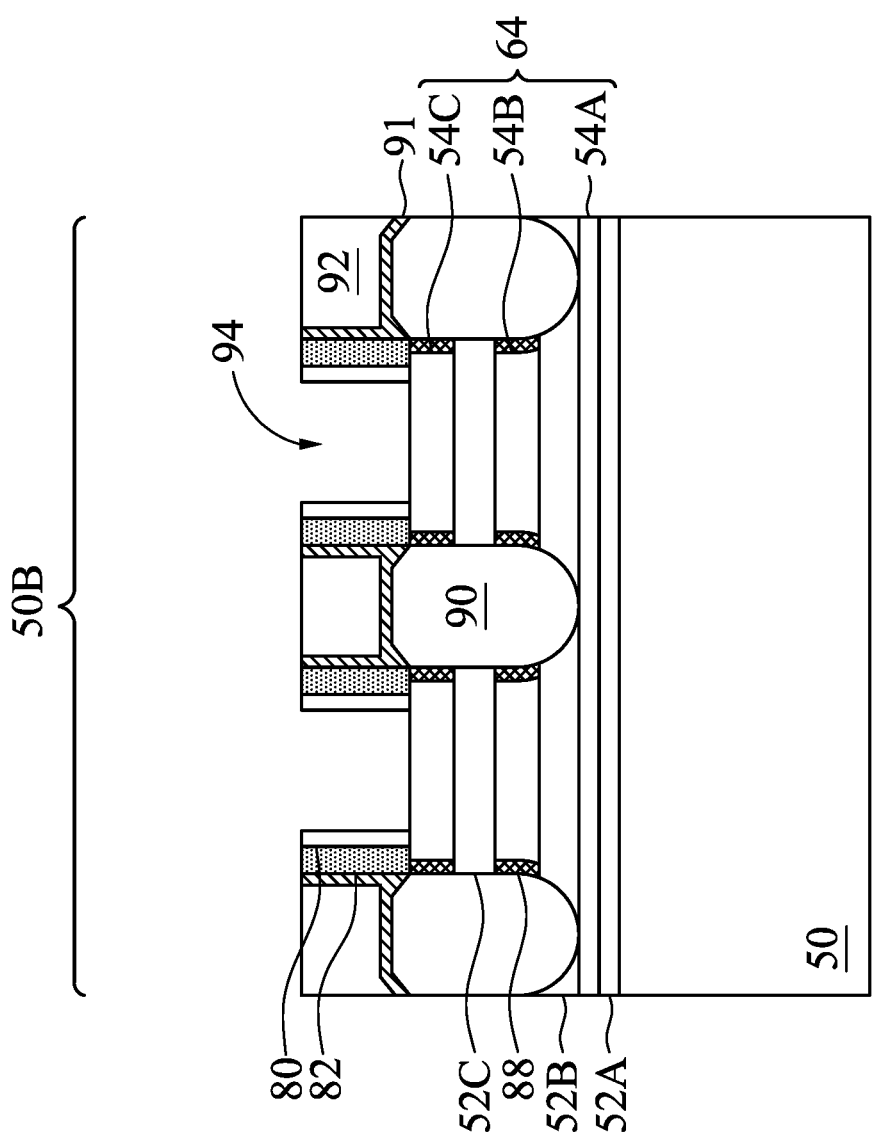

In FIGS. 14A-14C, the dummy gates 76, and the masks 78 if present, are removed in an etching step(s), so that recesses 94 are formed. Portions of the dummy dielectric layer 70 in the recesses 94 may also be removed. In some embodiments, only the dummy gates 76 are removed and the dummy dielectric layer 70 remains and is exposed by the recesses 94. In some embodiments, the dummy dielectric layer 70 is removed from recesses 94 in a first region of a die (e.g., a core logic region) and remains in recesses 94 in a second region of the die (e.g., an input/output region). In some embodiments, the dummy gates 76 are removed by an anisotropic dry etch process. For example, the etching process may include a dry etch process using reaction gas(es) that selectively etch the dummy gates 76 without etching the first ILD 92, the gate seal spacers 80, or the gate spacers 82. Each recess 94 exposes and/or overlies the multi-layer stacks 64. Portions of the multi-layer stacks 64 are disposed between neighboring pairs of the epitaxial source/drain regions 90. During the removal, the dummy dielectric layer 70 may be used as an etch stop layer when the dummy gates 76 are etched. The dummy dielectric layer 70 may then be optionally removed after the removal of the dummy gates 76.

Figure 15A:
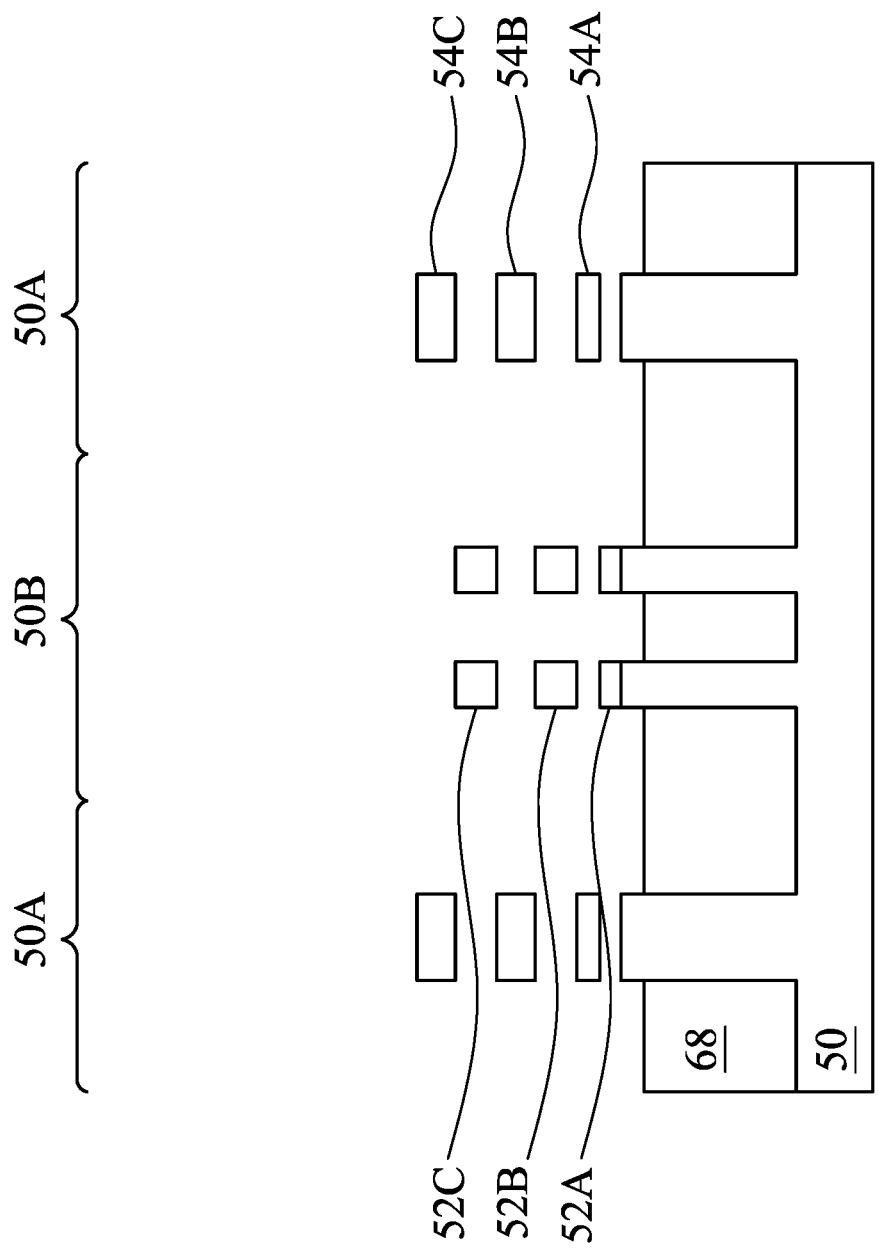
Figure 15B:
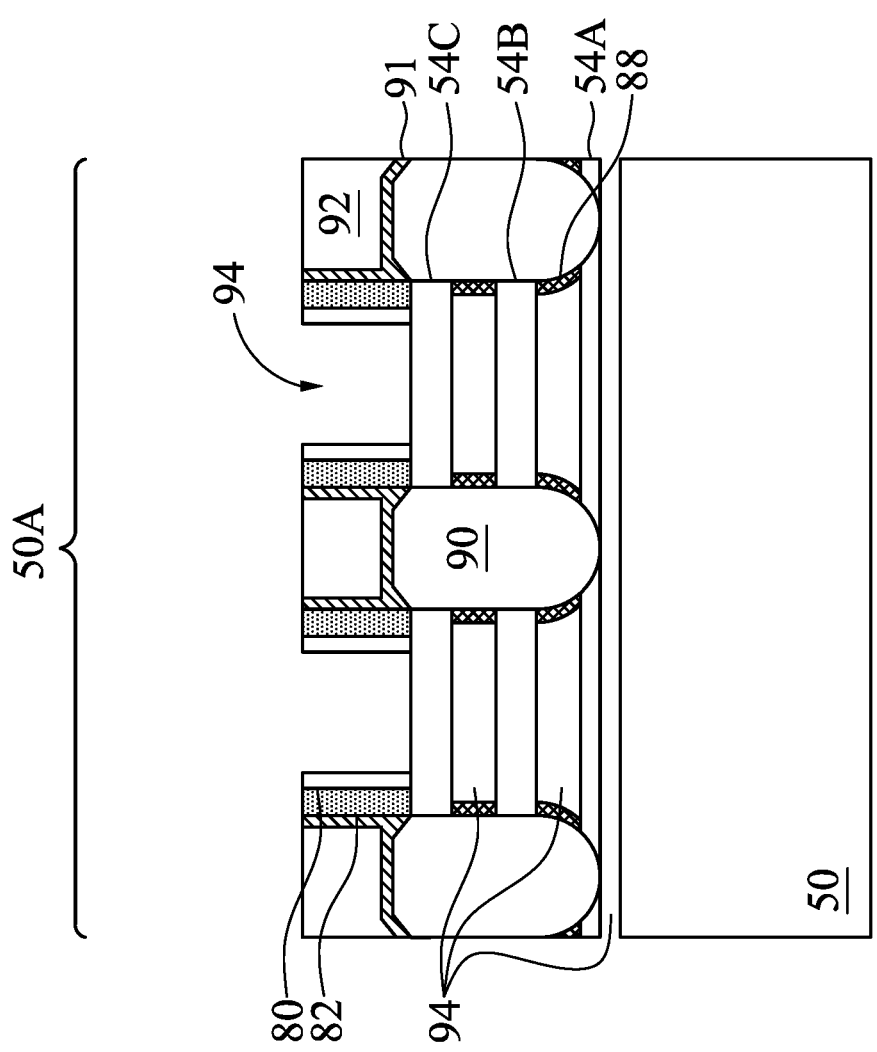
Figure 15C:
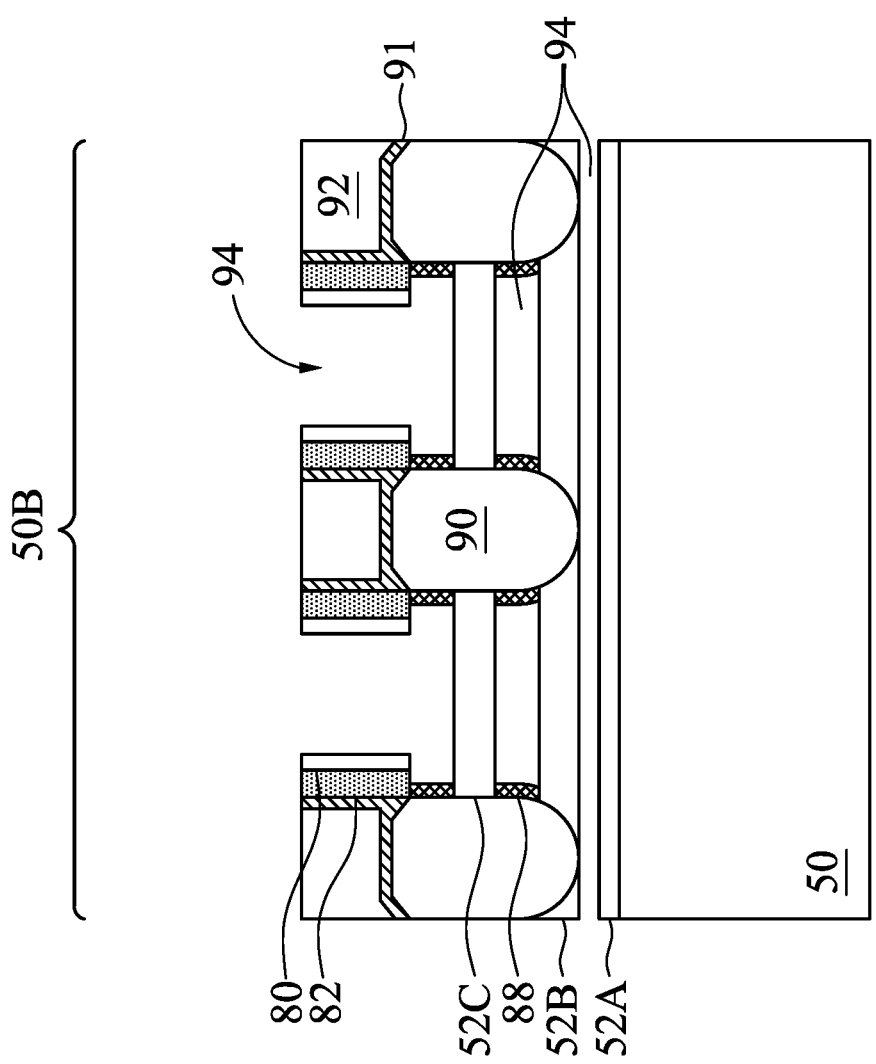

In FIGS. 15A-15C, the first semiconductor layers 52A-52C are removed from the regions 50A and the second semiconductor layers 54A-54C are removed from the region 50B, extending the recesses 94. The specific layers of the multi-layer stack 64 may be removed from the regions 50A and the region 50B by a photoresist or other masks (not separately illustrated). A mask, such as a photoresist, may be formed over the regions 50A, while removing the second semiconductor layers 54A-54C from the region 50B. The mask may then be removed. Subsequently, a mask, such as a photoresist, may be formed over the region 50B while removing the first semiconductor layers 52A-52C from the regions 50A. The mask may then be removed.

The layers of the multi-layer stack 64 may be removed by isotropic etching processes such as wet etching or the like. The etchants used to remove the first semiconductor layers 52A-52C may be selective to the materials of the second semiconductor layers 54A-54C, while the etchants used to etch the second semiconductor layers 54A-54C may be selective to the materials of the first semiconductor layers 52A-52C. In an embodiment in which the first semiconductor layers 52A-52C comprise the first semiconductor material (e.g., SiGe or the like) and the second semiconductor layers 54A-54C comprise the second semiconductor material (e.g., Si, SiC, or the like), tetramethylammonium hydroxide (TMAH), ammonium hydroxide ($NH_4OH$), or the like may be used remove layers of the multi-layer stack 64 in the regions 50A and diluted ammonium hydroxide-hydrogen peroxide mixture (APM), sulfuric acid-hydrogen peroxide mixture (SPM), or the like may be used to remove layers of the multi-layer stack 64 in the region 50B. A plasma, such as a plasma formed from hydrogen gas ($H_2$) or the like, may be used to remove the first semiconductor layers 52A-52C. A solution including hydrofluoric acid (HF) and hydrogen peroxide ($H_2O_2$), a solution including hydrofluoric acid, nitric acid ($HNO_3$), and water ($H_2O$), or the like may be used to remove the second semiconductor layers 54A-54C.

In FIGS. 16A-16D, gate dielectric layers 96 and gate electrodes 98 are formed for replacement gates. The gate dielectric layers 96 are deposited conformally in the recesses 94, such as on top surfaces and sidewalls of the first semiconductor layer 52A and top surfaces, sidewalls, and bottom surfaces of the first semiconductor layers 52B and 52C and the second semiconductor layers 54A-54C. The gate dielectric layers 96 may also be deposited on top surfaces of the substrate 50, the first ILD 92, the CESL 91, and the STI regions 68, on top surfaces, sidewalls, and bottom surfaces of the gate seal spacers 80, on top surfaces and bottom surfaces of the gate spacers 82, and on sidewalls of the inner spacers 88. In accordance with some embodiments, the gate dielectric layers 96 comprise silicon oxide, silicon nitride, or multilayers thereof. In some embodiments, the gate dielectric layers 96 include a high-k dielectric material, and in these embodiments, the gate dielectric layers 96 may have a k value greater than about 7.0, and may include a metal oxide or a silicate of hafnium, aluminum, zirconium, lanthanum, manganese, barium, titanium, lead, and combinations thereof. The formation methods of the gate dielectric layers 96 may include molecular-beam deposition (MBD), ALD, PECVD, and the like.

Figure 16A:
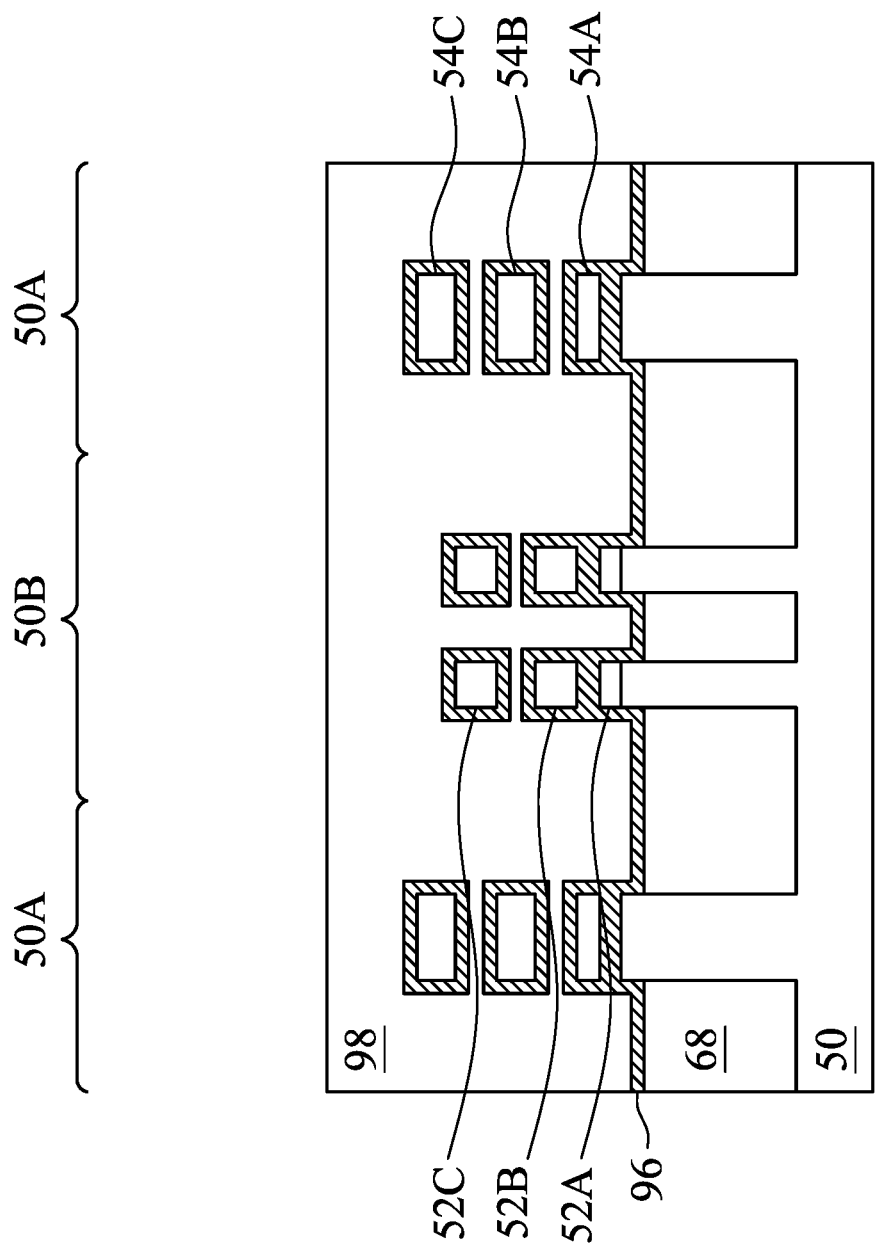
Figure 16B:
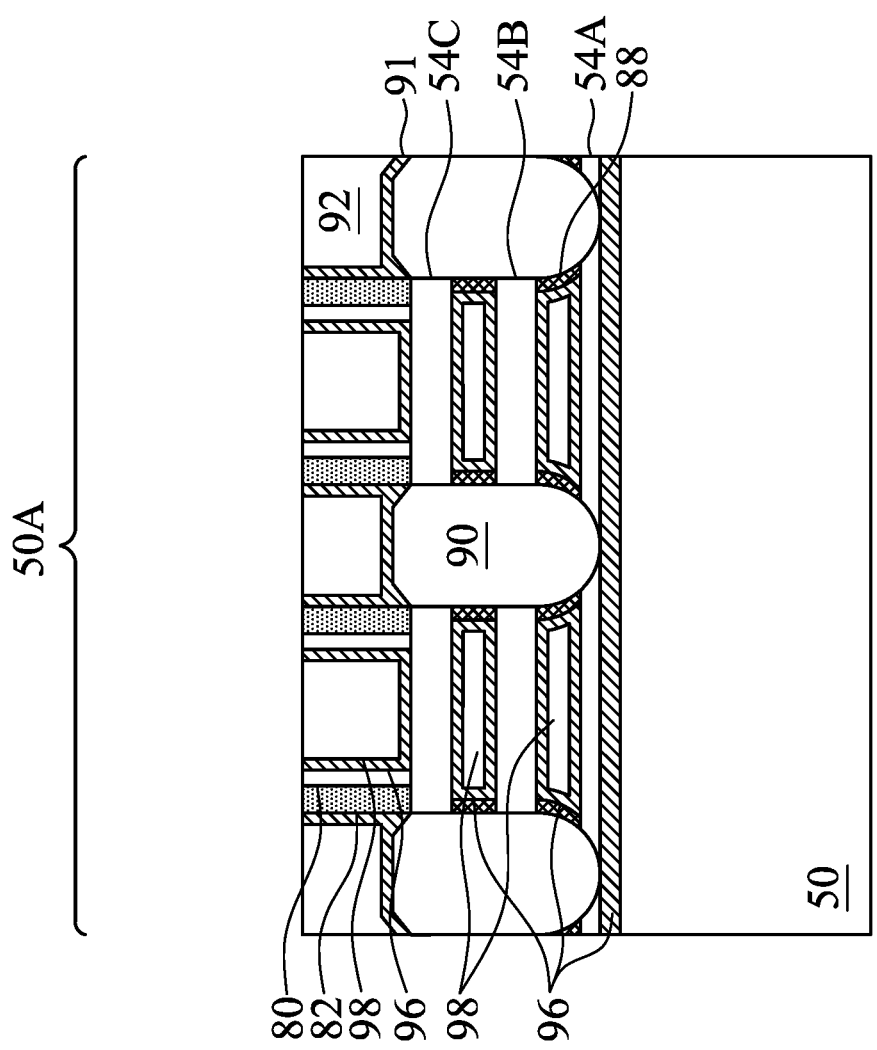
Figure 16C:
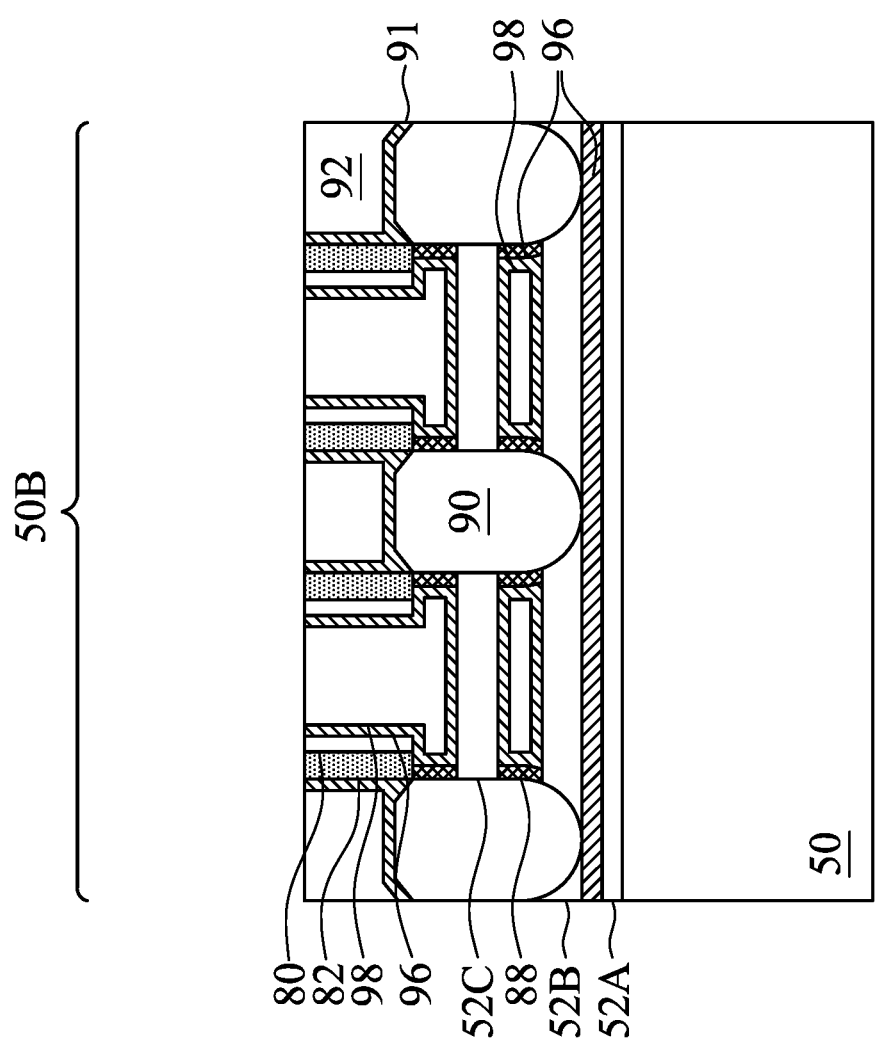
Figure 16D:
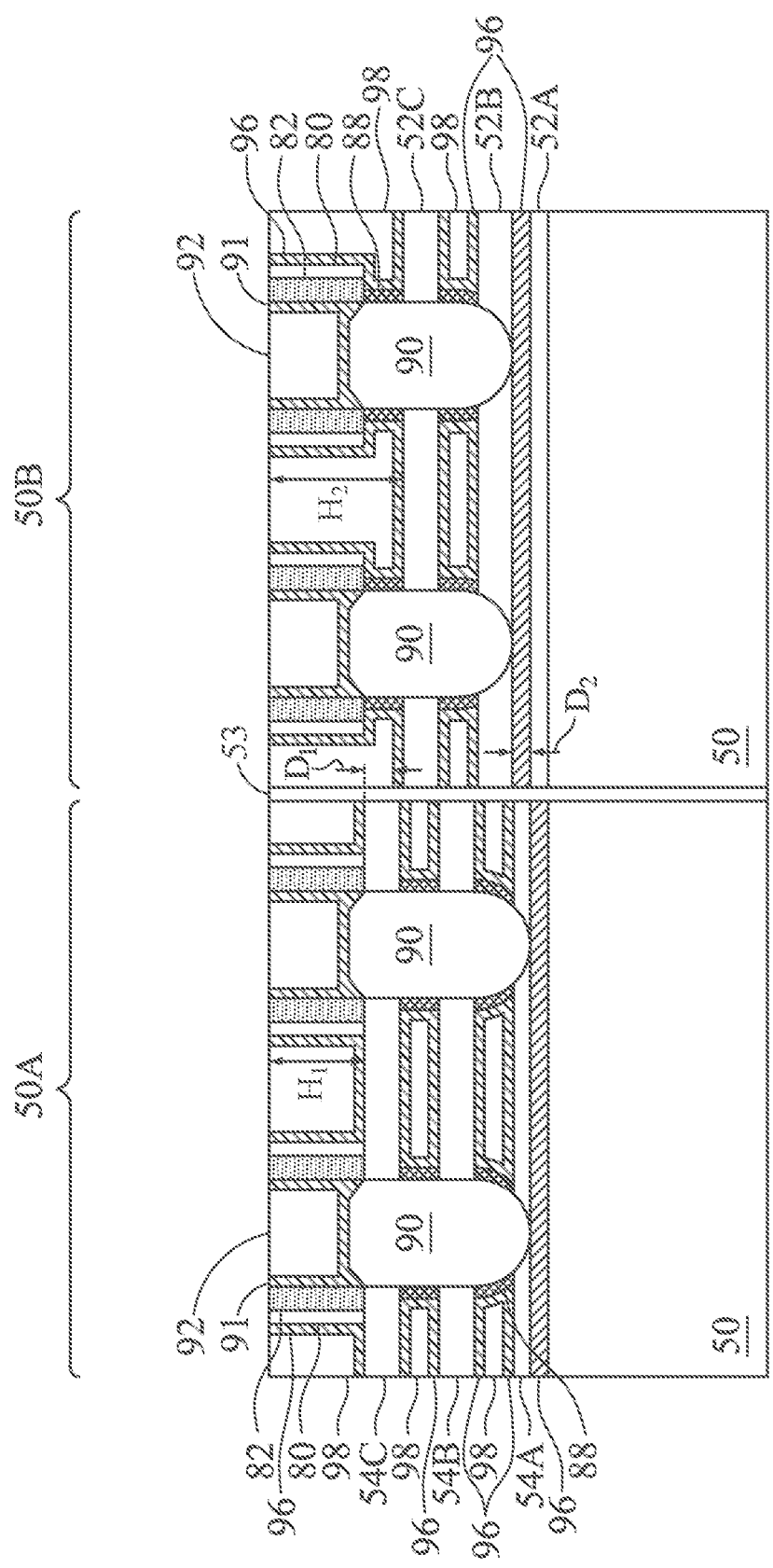

The gate dielectric layers 96 may have a thickness from about 2 nm to about 3 nm, such as about 2.5 nm. The gate dielectric layers 96 may have a thickness greater than half a thickness of both the first semiconductor layer 52A and the second semiconductor layer 54A. Specifically, portions of the gate dielectric layers 96 deposited in recesses formed by removing the first semiconductor layers 52B and 52C and the dummy gates 76 in the regions 50A may have a thickness greater than half a thickness of the first semiconductor layer 52A and portions of the gate dielectric layers 96 deposited in recesses formed by removing the second semiconductor layers 54B and 54C and the dummy gates 76 in the region 50B may have a thickness greater than half a thickness of the second semiconductor layer 54A. Because the thickness of the gate dielectric layers 96 is greater than half the thickness of the first semiconductor layer 52A and the second semiconductor layer 54A, the gate dielectric layers 96 fill portions of the recesses 94 left by removing the first semiconductor layer 52A from the region 50B and the portions of the recesses 94 left by removing the second semiconductor layer 54A from the regions 50A. As illustrated in FIGS. 16B-16D, the gate dielectric layers 96 may extend underneath the epitaxial source/drain regions 90, between the substrate 50 and the epitaxial source/drain regions 90 in both the regions 50A and the region 50B. The epitaxial source/drain regions 90 are insulated from the substrate 50 by the gate dielectric layers 96. As such, forming the gate dielectric layers 96 between the substrate 50 and each of the epitaxial source/drain regions 90 prevents leakage from the epitaxial source/drain regions 90 to the substrate 50, prevents latch-up and boosts performance. The portions of the gate dielectric layers 96 extending between the substrate 50 and the second semiconductor layer 54A/the epitaxial source/drain regions 90 in the region 50A and the portions of the gate dielectric layers 96 extending between the substrate 50 and the first semiconductor layer 52B/the epitaxial source/drain regions 90 in the region 50B may be referred to as isolation layers.

The gate electrodes 98 are deposited over the gate dielectric layers 96, respectively, and fill the remaining portions of the recesses 94. The gate electrodes 98 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 98 is illustrated in FIG. 14B, the gate electrodes 98 may comprise any number of liner layers, any number of work function tuning layers, and a fill material. In layers in which the gate electrodes 98 are formed of more than one layer, some or all of the layers making up the gate electrodes 98 may be formed in portions of the recesses 94 extending between the second semiconductor layer 54A and the second semiconductor layer 54B, the second semiconductor layer 54B and the second semiconductor layer 54C, and the first semiconductor layer 52B and the first semiconductor layer 52C, depending on the thicknesses of the layers making up the gate electrodes and the spacing of the recesses 94. The gate electrodes 98 may be formed by ALD, CVD, PVD, the like, or combinations thereof. In some embodiments, the gate electrodes 98 may be formed by ALD followed by PVD.

After the filling of the recesses 94, a planarization process, such as a CMP, may be performed to remove the excess portions of the gate dielectric layers 96 and the material of the gate electrodes 98, which excess portions are over the top surface of the first ILD 92. The remaining portions of material of the gate electrodes 98 and the gate dielectric layers 96 thus form replacement gates of the resulting NSFETs. The gate electrodes 98 and the gate dielectric layers 96 may be collectively referred to as a "gate stack." The gate and the gate stacks may surround each of the first semiconductor layers 52B and 52C and the second semiconductor layers 54B and 54C.

The formation of the gate dielectric layers 96 in the regions 50A and the region 50B may occur simultaneously such that the gate dielectric layers 96 in each region are formed from the same materials, and the formation of the gate electrodes 98 may occur simultaneously such that the gate electrodes 98 in each region are formed from the same materials. In some embodiments, the gate dielectric layers 96 in each region may be formed by distinct processes, such that the gate dielectric layers 96 may be different materials, and/or the gate electrodes 98 in each region may be formed by distinct processes, such that the gate electrodes 98 may be different materials. Various masking steps may be used to mask and expose appropriate regions when using distinct processes.

In FIG. 16D, a region 50A is illustrated next to a region 50B to illustrate comparisons between the regions 50A and the region 50B. The region 50A may be physically separated from the region 50B (as illustrated by divider 53). As a result of different semiconductor layers being used for the channel regions in the regions 50A and the region 50B, the gate stacks may have different heights, the epitaxial source/drain regions 90 may extend to different depths, and top surfaces of the channel regions (e.g., the first semiconductor layers 52B and 52C in the region 50B and the second semiconductor layers 54B and 54C in the regions 50A) may be disposed at different heights in the regions 50A and the region 50B. For example, as illustrated in FIG. 16D, the gate stacks in the region 50B may have heights $H_2$ greater than heights $H_1$ of the gate stacks in the region 50A. A height difference between the gate stacks in the region 50B and the region 50A may be from about 8 nm to about 10 nm, such as about 9 nm. Top surfaces of the channel regions in the region 50A may be disposed above channel regions in the region 50B. For example, a top surface of the second semiconductor layer 54C in the region 50A may be disposed above a top surface of the first semiconductor layer 52C in the region 50B a distance $D_1$ from about 8 nm to about 10 nm, such as about 9 nm. Bottom surfaces of the epitaxial source/drain regions 90 in the region 50B may be disposed above bottom surfaces of the epitaxial source/drain regions 90 in the region 50A. For example, bottom surfaces of the epitaxial source/drain regions 90 in the region 50B may be disposed above bottom surfaces of the epitaxial source/drain regions 90 in the region 50A a distance $D_2$ from about 4 nm to about 6 nm, such as about 5 nm.

Figure 17A:
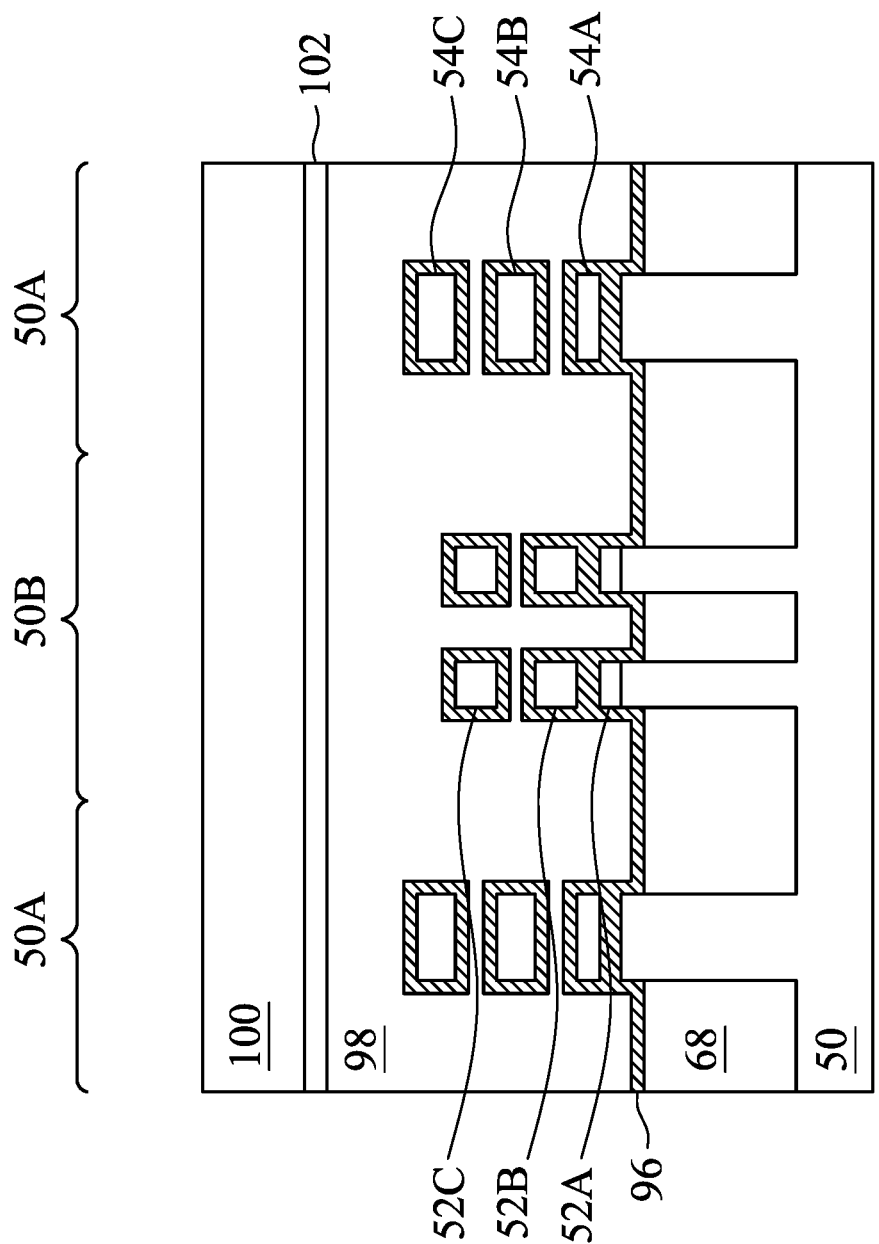
Figure 17B:
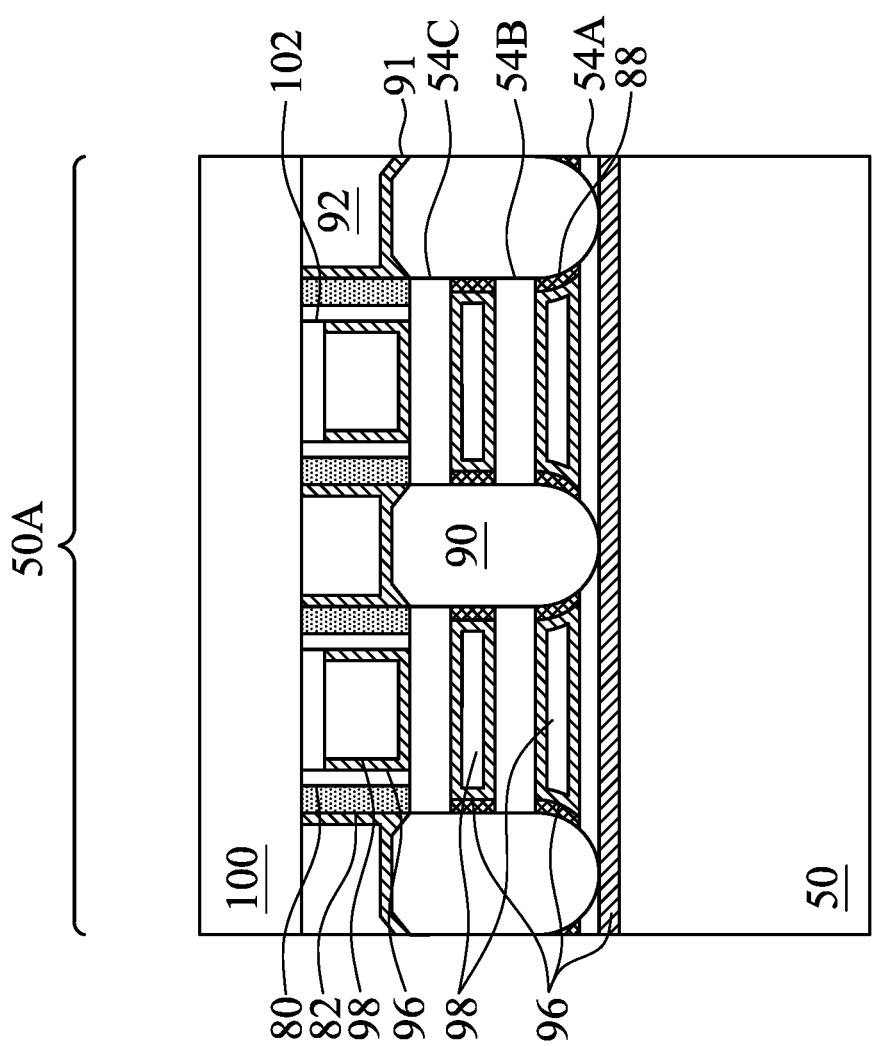
Figure 17C:
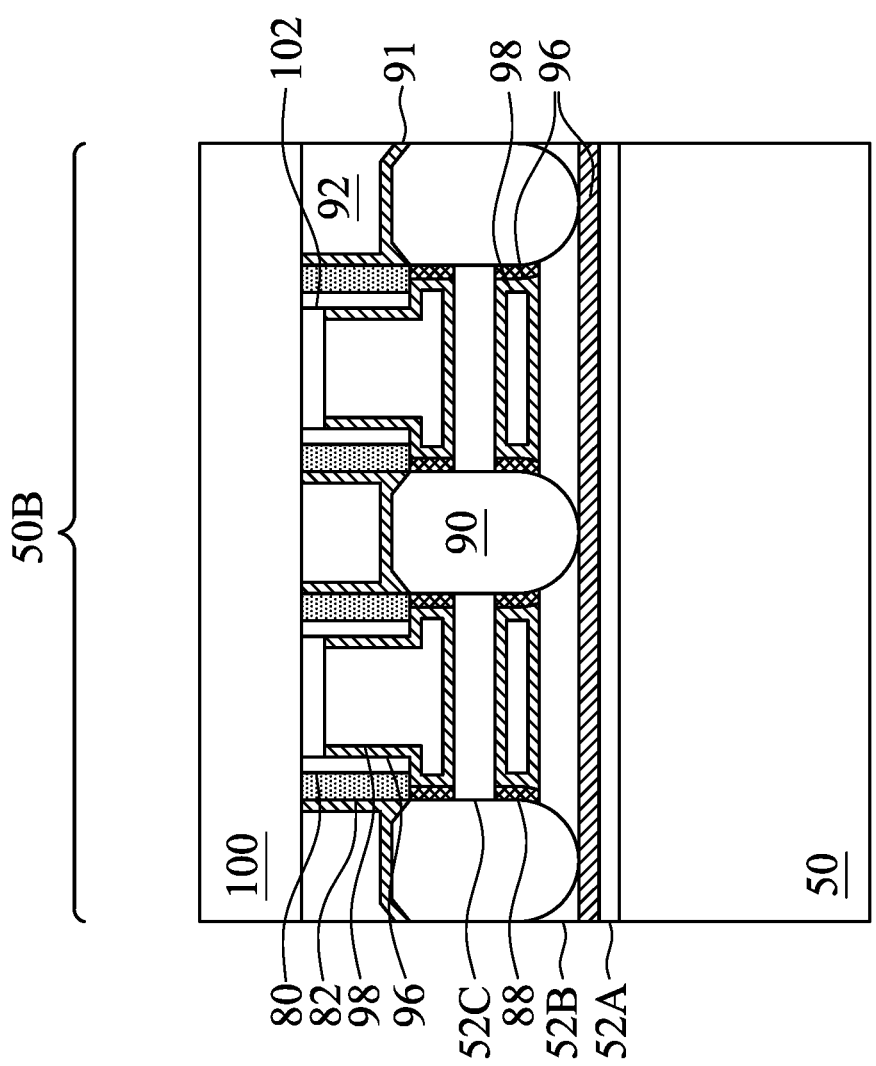

In FIGS. 17A-17C, a second ILD 100 is deposited over the first ILD 92. In some embodiments, the second ILD 100 is a flowable film formed by a flowable CVD method. In some embodiments, the second ILD 100 is formed of a dielectric material such as PSG, BSG, BPSG, USG, or the like, and may be deposited by any suitable method, such as CVD, PECVD, or the like. In accordance with some embodiments, before the formation of the second ILD 100, the gate stack (including the gate dielectric layers 96 and the corresponding overlying gate electrodes 98) is recessed, so that a recess is formed directly over the gate stack and between opposing portions of gate seal spacers 80. A gate mask 102 comprising one or more layers of dielectric material, such as silicon nitride, silicon oxynitride, or the like, is filled in the recess, followed by a planarization process to remove excess portions of the dielectric material extending over the first ILD 92. Subsequently formed gate contacts (such as the gate contacts 104, discussed below with respect to FIGS. 18A-18C) penetrate through the gate mask 102 to contact the top surface of the recessed gate electrodes 98.

Figure 18A:
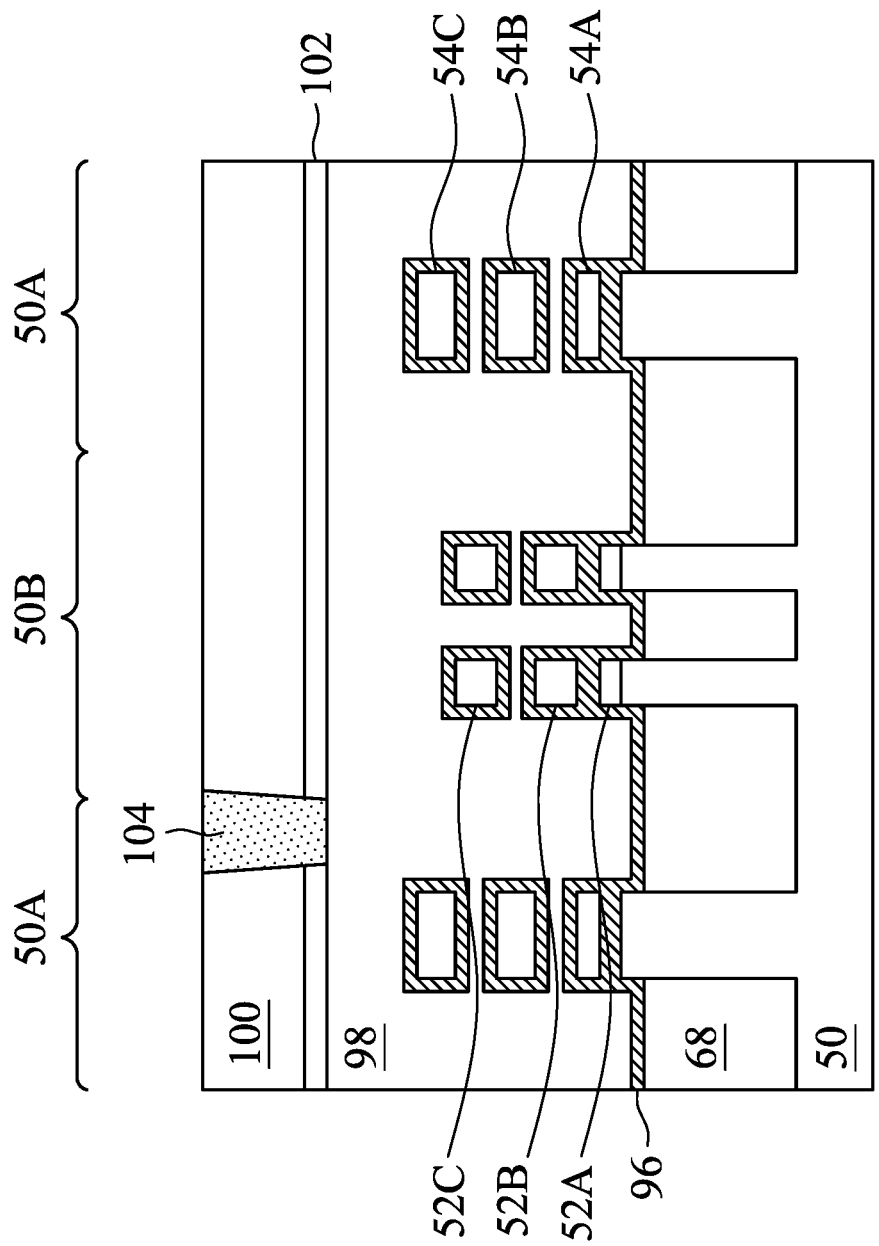
Figure 18B:
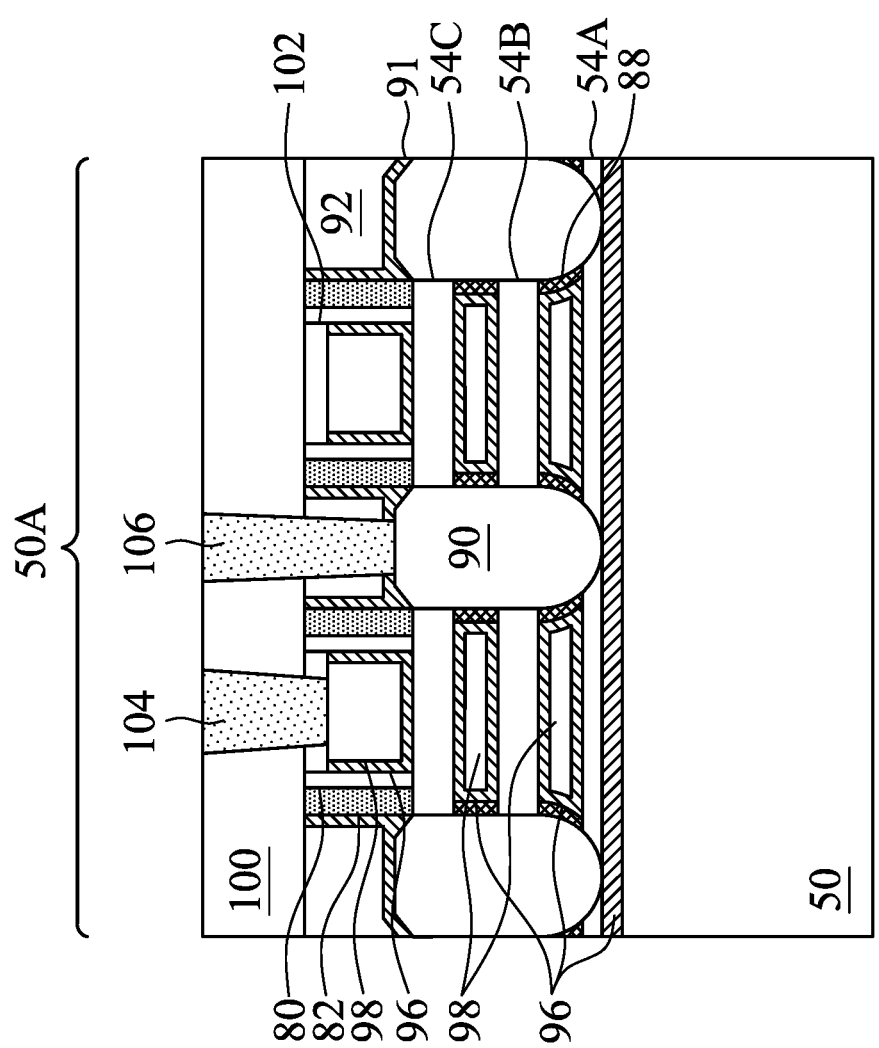
Figure 18C:
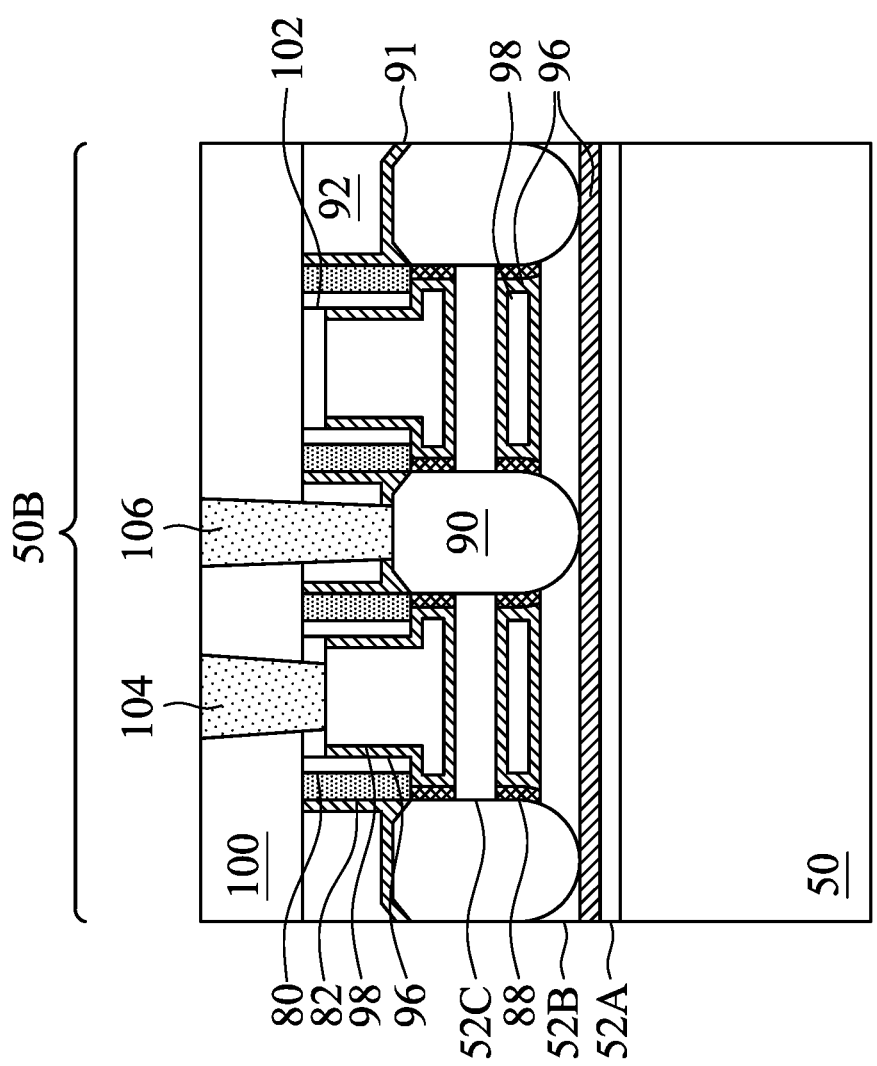

In FIGS. 18A-18C, gate contacts 104 and source/drain contacts 106 are formed. Openings for the source/drain contacts 106 are formed through the second ILD 100 and the first ILD 92, and openings for the gate contacts 104 are formed through the second ILD 100 and the gate mask 102. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 100. The remaining liner and conductive material form the source/drain contacts 106 and gate contacts 104 in the openings. An anneal process may be performed to form a silicide at the interface between the source/drain contacts 106 and each of the epitaxial source/drain regions 90. The source/drain contacts 106 are physically and electrically coupled to the epitaxial source/drain regions 90, and the gate contacts 104 are physically and electrically coupled to the gate electrodes 98. The source/drain contacts 106 and gate contacts 104 may be formed in different processes, or may be formed in the same process. Although shown as being formed in the same cross-sections, it should be appreciated that each of the source/drain contacts 106 and the gate contacts 104 may be formed in different cross-sections, which may avoid shorting of the contacts.

As discussed above, replacing the first semiconductor layer 52A and the second semiconductor layer 54A with the gate dielectric layers 96 insulates the epitaxial source/drain regions 90 from the substrate 50. This prevents leakage from the epitaxial source/drain regions 90 to the substrate 50, prevents latch-up and boosts performance.

In accordance with an embodiment, a semiconductor device includes a semiconductor substrate; a gate stack over the semiconductor substrate, the gate stack including a gate electrode and a gate dielectric; a first epitaxial source/drain region adjacent the gate stack; and a high-k dielectric extending between the semiconductor substrate and the first epitaxial source/drain region, the high-k dielectric contacting the first epitaxial source/drain region, the gate dielectric and the high-k dielectric including the same material. In an embodiment, the semiconductor device further includes a second epitaxial source/drain region adjacent the gate stack opposite the first epitaxial source/drain region, the high-k dielectric extending continuously from below the first epitaxial source/drain region, under the gate stack, to below the second epitaxial source/drain region. In an embodiment, the semiconductor device further includes a first semiconductor layer between the high-k dielectric and the gate stack; and a plurality of channel regions over the first semiconductor layer and the high-k dielectric, the plurality of channel regions including the same material as the first semiconductor layer, the gate stack extending between the first semiconductor layer and the plurality of channel regions and between channel regions of the plurality of channel regions. In an embodiment, the first semiconductor layer and the plurality of channel regions include silicon, and the first epitaxial source/drain region includes silicon phosphide. In an embodiment, the semiconductor device further includes a first semiconductor layer between the semiconductor substrate and the high-k dielectric, the first semiconductor layer including a material different from a material of the semiconductor substrate. In an embodiment, the semiconductor device further includes a plurality of channel regions over the first semiconductor layer and the high-k dielectric, the plurality of channel regions including the same material as the first semiconductor layer, the gate stack extending between channel regions of the plurality of channel regions. In an embodiment, the first semiconductor layer and the plurality of channel regions including silicon germanium, and the first epitaxial source/drain region includes silicon germanium. In an embodiment, the high-k dielectric has a thickness from 2 nm to 3 nm.

In accordance with another embodiment, a method includes depositing a multi-layer stack over a semiconductor substrate, the multi-layer stack including alternating layers of a first semiconductor material and a second semiconductor material; forming an epitaxial source/drain region in the multi-layer stack extending at least partially through the multi-layer stack; removing a first layer and a second layer of the multi-layer stack to form a first recess and a second recess, respectively; depositing a gate dielectric layer in the first recess and the second recess, the gate dielectric layer filling the first recess to form a first isolation layer, the first isolation layer extending between the epitaxial source/drain region and the semiconductor substrate; and depositing a gate electrode material in the second recess. In an embodiment, forming the epitaxial source/drain region includes etching the multi-layer stack to form a first opening exposing a top surface of the first layer, and epitaxially growing the epitaxial source/drain region such that the epitaxial source/drain region fills the first opening. In an embodiment, the first layer is deposited to a thickness from 4 nm to 6 nm and the second layer is deposited to a thickness from 8 nm to 10 nm. In an embodiment, the gate dielectric layer is deposited by atomic layer deposition, and the gate electrode material is formed by atomic layer deposition and physical vapor deposition. In an embodiment, depositing the multi-layer stack includes depositing a third layer over the second layer and the first layer, depositing the gate dielectric layer includes depositing the gate dielectric layer on four surfaces of the third layer of the multi-layer stack. In an embodiment, removing the first layer and the second layer of the multi-layer stack includes a selective etching process which etches the first layer and the second layer at a rate faster than the selective etching process etches the third layer.

In accordance with yet another embodiment, a method includes depositing a multi-layer stack over a semiconductor substrate, the multi-layer stack including a first sacrificial layer over the semiconductor substrate, a second sacrificial layer over the first sacrificial layer, a first channel layer over the second sacrificial layer, and a second channel layer over the first channel layer; forming a first source/drain region extending through the second channel layer, the first channel layer, and the second sacrificial layer to a top surface of the first sacrificial layer; etching the first channel layer and the first sacrificial layer from a first region of the semiconductor device using a first etch process; and depositing a first dielectric layer in recesses formed by etching the first channel layer and the first sacrificial layer, the first dielectric layer filling the recesses formed by etching the first sacrificial layer. In an embodiment, the method further includes forming a second source/drain region extending through the second channel layer and the first channel layer to a top surface of the second sacrificial layer; etching the second channel layer and the second sacrificial layer from a second region of the semiconductor device using a second etch process; and depositing a second dielectric layer in recesses formed by etching the second channel layer and the second sacrificial layer, the second dielectric layer filling the recesses formed by etching the second sacrificial layer. In an embodiment, the first region is an NMOS region, the second region is a PMOS region, the first sacrificial layer and the first channel layer include silicon germanium, and the second sacrificial layer and the second channel layer include silicon. In an embodiment, the method further includes etching a sidewall of the second channel layer in the first region to form a first recess, forming the first source/drain region including etching the second channel layer, the first channel layer, and the second sacrificial layer to form a second recess, the sidewalls of the second channel layer being etched through the second recess; and etching a sidewall of the first channel layer in the second region to form a third recess, forming the second source/drain region including etching the second channel layer and the first channel layer to form a fourth recess, the sidewalls of the first channel layer being etched through the fourth recess. In an embodiment, the method further includes conformally depositing an inner spacer layer in the first recess, the second recess, the third recess, and the fourth recess, the inner spacer layer filling the first recess and the third recess; and etching the inner spacer layer to remove portions of the inner spacer layer outside the first recess and the third recess. In an embodiment, the first dielectric layer is deposited in the recess formed by etching the first channel layer to a thickness greater than half a thickness of the first sacrificial layer, and the second dielectric layer is deposited in the recess formed by etching the second channel layer to a thickness greater than half a thickness of the second sacrificial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    depositing a multi-layer stack over a semiconductor substrate, the multi-layer stack comprising alternating layers of a first semiconductor material and a second semiconductor material;
    forming an epitaxial source/drain region in the multi-layer stack extending at least partially through the multi-layer stack;
    removing a first layer and a second layer of the multi-layer stack to form a first recess and a second recess, respectively, wherein the first layer and the second layer comprise the first semiconductor material;
    depositing a gate dielectric layer in the first recess and the second recess, the gate dielectric layer filling the first recess to form a first isolation layer, the first isolation layer extending between the epitaxial source/drain region and the semiconductor substrate, wherein the first isolation layer extends past opposite sidewalls of the epitaxial source/drain region in a direction parallel to a major surface of the semiconductor substrate, wherein the first isolation layer extends from a third layer of the multi-layer stack to a fourth layer of the multi-layer stack, and wherein the third layer and the fourth layer comprise the second semiconductor material; and
    depositing a gate electrode material in the second recess.

2. The method of claim 1, wherein forming the epitaxial source/drain region comprises etching the multi-layer stack to form a first opening exposing a top surface of the first layer, and epitaxially growing the epitaxial source/drain region such that the epitaxial source/drain region fills the first opening.

3. The method of claim 1, wherein the first layer is deposited to a first thickness from 4 nm to 6 nm and the second layer is deposited to a second thickness from 8 nm to 10 nm.

4. The method of claim 1, wherein the gate dielectric layer is deposited by atomic layer deposition, and wherein the gate electrode material is formed by atomic layer deposition and physical vapor deposition.

5. The method of claim 1, wherein depositing the multi-layer stack comprises depositing the fourth layer over the second layer and the first layer, wherein depositing the gate dielectric layer comprises depositing the gate dielectric layer on four surfaces of the fourth layer of the multi-layer stack.

6. The method of claim 5, wherein removing the first layer and the second layer of the multi-layer stack comprises a selective etching process which etches the first layer and the second layer at a rate faster than the selective etching process etches the third layer and the fourth layer.

7. A method of forming a semiconductor device, the method comprising:
depositing a multi-layer stack over a semiconductor substrate, the multi-layer stack comprising a first sacrificial layer over the semiconductor substrate, a second sacrificial layer over the first sacrificial layer, a first channel layer over the second sacrificial layer, and a second channel layer over the first channel layer;
forming a first source/drain region extending through the second channel layer, the first channel layer, and the second sacrificial layer to a first top surface of the first sacrificial layer;
after forming the first source/drain region, etching the first channel layer and the first sacrificial layer from a first region of the semiconductor device using a first etch process;
after forming the first source/drain region, etching the second channel layer and the second sacrificial layer from a second region of the semiconductor device using a second etch process; and
depositing a first dielectric layer in a first recess and a second recess formed by the first etch process, the first dielectric layer filling the second recess.

8. The method of claim 7, further comprising:
forming a second source/drain region extending through the second channel layer and the first channel layer to a second top surface of the second sacrificial layer; and
depositing a second dielectric layer in a third recess and a fourth recess formed by the second etch process, the second dielectric layer filling the fourth recess.

9. The method of claim 8, wherein the first region is an NMOS region, wherein the second region is a PMOS region, wherein the first sacrificial layer and the first channel layer comprise silicon germanium, and wherein the second sacrificial layer and the second channel layer comprise silicon.

10. The method of claim 8, further comprising:
etching a first sidewall of the second channel layer in the first region to form a fifth recess, wherein forming the first source/drain region comprises etching the second channel layer, the first channel layer, and the second sacrificial layer to form a sixth recess, wherein the first sidewall of the second channel layer is etched through the sixth recess; and
etching a second sidewall of the first channel layer in the second region to form a seventh recess, wherein forming the second source/drain region comprises etching the second channel layer and the first channel layer to form an eighth recess, wherein the second sidewall of the first channel layer is etched through the eighth recess.

11. The method of claim 10, further comprising:
conformally depositing an inner spacer layer in the fifth recess, the sixth recess, the seventh recess, and the eighth recess, the inner spacer layer filling the fifth recess and the seventh recess; and
etching the inner spacer layer to remove portions of the inner spacer layer outside the fifth recess and the seventh recess.

12. The method of claim 8, wherein the first dielectric layer is deposited in the first recess, wherein the first dielectric layer is deposited to a first thickness greater than half a second thickness of the first sacrificial layer, wherein the second dielectric layer is deposited in the third recess, and wherein the second dielectric layer is deposited to a third thickness greater than half a fourth thickness of the second sacrificial layer.

13. A method comprising:
depositing a multi-layer stack over a semiconductor substrate, the multi-layer stack comprising alternating layers of a first semiconductor material and a second semiconductor material;
forming a dummy gate stack over the multi-layer stack;
forming a gate spacer over the multi-layer stack adjacent the dummy gate stack;
patterning the multi-layer stack to form a first recess over the semiconductor substrate;
forming a first epitaxial source/drain region in the first recess;
removing a first layer and a second layer from the multi-layer stack in a first region to form a second recess and a third recess, respectively, wherein the first layer and the second layer comprise the first semiconductor material;
removing a third layer and a fourth layer from the multi-layer stack in a second region to form a fourth recess and a fifth recess, respectively, wherein the third layer and the fourth layer comprise the second semiconductor material;
depositing a high-k dielectric in the second recess, wherein a top surface of the high-k dielectric is in physical contact with a bottom surface of the first epitaxial source/drain region; and
depositing a gate stack in the third recess, the gate stack comprising a gate electrode and a gate dielectric, wherein the high-k dielectric and the gate dielectric comprise a same material, wherein the gate stack comprises an inverted T-shaped portion extending below the gate spacer in a direction perpendicular to a major surface of the semiconductor substrate.

14. The method of claim 13, further comprising:
patterning the multi-layer stack to form a sixth recess over the semiconductor substrate; and
forming a second epitaxial source/drain region in the sixth recess, wherein the gate stack is deposited between the first epitaxial source/drain region and the second epitaxial source/drain region, wherein the high-k dielectric is deposited extending continuously from below the first epitaxial source/drain region, under the gate stack, to below the second epitaxial source/drain region.

15. The method of claim 13, wherein the third layer and the fourth layer of the multi-layer stack remain in the first region after removing the first layer and the second layer, wherein the third layer is between the high-k dielectric and the gate stack, wherein the fourth layer forms a channel region, and wherein the gate stack is between the third layer and the fourth layer.

16. The method of claim 15, wherein the third layer and the fourth layer comprise silicon, and wherein the first epitaxial source/drain region comprises silicon phosphide.

17. The method of claim 13, wherein the third layer of the multi-layer stack remains after removing the first layer and the second layer in the first region, wherein the second semiconductor material is different from a third semiconductor material of the semiconductor substrate, and wherein the third layer is between the semiconductor substrate and the high-k dielectric.

18. The method of claim 17, wherein the fourth layer and a fifth layer of the multi-layer stack remain after removing the first layer and the second layer in the first region, wherein the fifth layer comprises the second semiconductor material, wherein the fourth layer is between the high-k dielectric and the gate stack, and wherein the gate stack is between the fourth layer and the fifth layer.

19. The method of claim 18, wherein the second semiconductor material comprises silicon germanium, and wherein the first epitaxial source/drain region comprises silicon germanium.

20. The method of claim 13, wherein the high-k dielectric has a thickness from 2 nm to 3 nm.

\* \* \* \* \*